United States Patent
More et al.

(10) Patent No.: US 11,817,500 B2
(45) Date of Patent: Nov. 14, 2023

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Shahaji B. More, Hsinchu (TW); Chandrashekhar Prakash Savant, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/885,435

(22) Filed: Aug. 10, 2022

(65) Prior Publication Data
US 2022/0384653 A1 Dec. 1, 2022

Related U.S. Application Data

(63) Continuation of application No. 17/033,479, filed on Sep. 25, 2020, now Pat. No. 11,489,075.
(Continued)

(51) Int. Cl.
*H01L 29/78* (2006.01)
*H01L 21/8238* (2006.01)
(Continued)

(52) U.S. Cl.
CPC .... *H01L 29/7848* (2013.01); *H01L 21/02521* (2013.01); *H01L 21/28518* (2013.01);
(Continued)

(58) Field of Classification Search
CPC ........... H01L 29/7848; H01L 21/02521; H01L 21/28518; H01L 21/823814;
(Continued)

(56) References Cited

U.S. PATENT DOCUMENTS

| 8,962,400 B2 | 2/2015 | Tsai et al. |
| 9,093,514 B2 | 7/2015 | Tsai et al. |
| (Continued) | | |

FOREIGN PATENT DOCUMENTS

| CN | 110957221 A | 4/2020 |
| CN | 111223935 A | 6/2020 |
| (Continued) | | |

OTHER PUBLICATIONS

Non-Final Office Action issued in U.S. Appl. No. 17/033,479, dated Mar. 4, 2022.
(Continued)

*Primary Examiner* — Karen Kusumakar
*Assistant Examiner* — Adam S Bowen
(74) *Attorney, Agent, or Firm* — McDermott Will & Emery LLP

(57) ABSTRACT

In a method of manufacturing a semiconductor device, first and second fin structures are formed over a substrate, an isolation insulating layer is formed over the substrate, a gate structure is formed over channel regions of the first and second fin structures, source/drain regions of the first and second fin structure are recessed, and an epitaxial source/drain structure is formed over the recessed first and second fin structures. The epitaxial source/drain structure is a merged structure having a merger point, and a height of a bottom of the merger point from an upper surface of the isolation insulating layer is 50% or more of a height of the channel regions of the first and second fin structures from the upper surface of the isolation insulating layer.

20 Claims, 16 Drawing Sheets

Related U.S. Application Data

(60) Provisional application No. 63/045,421, filed on Jun. 29, 2020.

(51) Int. Cl.

| | | |
|---|---|---|
| *H01L 29/08* | (2006.01) | |
| *H01L 29/06* | (2006.01) | |
| *H01L 29/24* | (2006.01) | |
| *H01L 29/267* | (2006.01) | |
| *H01L 21/02* | (2006.01) | |
| *H01L 21/285* | (2006.01) | |
| *H01L 29/66* | (2006.01) | |
| *H01L 27/092* | (2006.01) | |

(52) U.S. Cl.
CPC ........... *H01L 21/823814* (2013.01); *H01L 21/823821* (2013.01); *H01L 21/823871* (2013.01); *H01L 21/823878* (2013.01); *H01L 27/0924* (2013.01); *H01L 29/0653* (2013.01); *H01L 29/0847* (2013.01); *H01L 29/24* (2013.01); *H01L 29/267* (2013.01); *H01L 29/66492* (2013.01); *H01L 29/66545* (2013.01); *H01L 29/66636* (2013.01); *H01L 29/66795* (2013.01); *H01L 29/7833* (2013.01); *H01L 29/7851* (2013.01)

(58) Field of Classification Search
CPC ..... H01L 21/823821; H01L 21/823871; H01L 21/823878; H01L 27/0924; H01L 29/0653; H01L 29/0847; H01L 29/24; H01L 29/267; H01L 29/66492; H01L 29/66545; H01L 29/66636; H01L 29/66795; H01L 29/7833; H01L 29/7851; H01L 21/0245; H01L 21/02505; H01L 21/02532; H01L 21/02576; H01L 21/0262; H01L 21/02639; H01L 21/0265; H01L 29/665; H01L 29/045; H01L 29/161; H01L 29/165; H01L 29/785; H01L 21/823418; H01L 21/823431; H01L 27/0886

See application file for complete search history.

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,831,116 B2 | 11/2017 | Lee et al. |
| 9,859,380 B2 | 1/2018 | Lee et al. |
| 9,953,875 B1 * | 4/2018 | Cheng ............... H01L 21/02576 |
| 9,991,257 B2 | 6/2018 | Park et al. |
| 10,134,902 B2 | 11/2018 | Lee et al. |
| 10,163,898 B2 | 12/2018 | Cheng et al. |
| 10,269,932 B1 * | 4/2019 | Arya ................... H01L 29/0653 |
| 10,453,943 B2 | 10/2019 | Lin et al. |
| 10,483,266 B2 | 11/2019 | Lee et al. |
| 10,510,875 B2 | 12/2019 | Liao et al. |
| 10,867,861 B2 | 12/2020 | Lin et al. |
| 10,896,964 B2 | 1/2021 | Yu et al. |
| 11,069,579 B2 | 7/2021 | Wang et al. |
| 11,616,142 B2 | 3/2023 | Yu et al. |
| 2015/0187943 A1 | 7/2015 | Lee et al. |
| 2017/0053912 A1 | 2/2017 | Ching et al. |
| 2017/0148797 A1 | 5/2017 | Kim et al. |
| 2017/0256456 A1 | 9/2017 | Lee et al. |
| 2017/0309624 A1 | 10/2017 | Cheng et al. |
| 2018/0151703 A1 | 5/2018 | Lin et al. |
| 2020/0006159 A1 | 1/2020 | Shih et al. |
| 2020/0075725 A1 | 3/2020 | Wu et al. |
| 2020/0105621 A1 | 4/2020 | Lin et al. |
| 2020/0105934 A1 | 4/2020 | Ma et al. |
| 2020/0135914 A1 | 4/2020 | Lin et al. |
| 2020/0168723 A1 | 5/2020 | Hsu et al. |
| 2020/0168735 A1 | 5/2020 | Yu et al. |
| 2020/0220015 A1 | 7/2020 | Jang et al. |

FOREIGN PATENT DOCUMENTS

| | | |
|---|---|---|
| KR | 10-2020-0026723 A | 3/2010 |
| KR | 1020160125208 A | 10/2016 |
| KR | 10-2017-0059234 A | 5/2017 |
| KR | 1020170121667 A | 11/2017 |
| KR | 1020180060949 A | 6/2018 |
| KR | 1020180069662 A | 6/2018 |
| KR | 1020180118028 A | 10/2018 |
| KR | 1020190013665 A | 2/2019 |
| KR | 10-2019-0099385 A | 8/2019 |
| KR | 1020200045398 A | 5/2020 |
| TW | 202013455 A | 4/2020 |

OTHER PUBLICATIONS

Notice of Allowance issued in U.S. Appl. No. 17/033,479, dated Jun. 24, 2022.

* cited by examiner

METHOD OF MANUFACTURING A SEMICONDUCTOR DEVICE AND A SEMICONDUCTOR DEVICE

RELATED APPLICATIONS

This application is a continuation of U.S. patent application Ser. No. 17/033,479 filed Sep. 25, 2020, which claims priority to U.S. Provisional Patent Application No. 63/045,421 filed Jun. 29, 2020, the entire contents of each of which are incorporated herein by reference.

BACKGROUND

The disclosure relates to a semiconductor integrated circuit, and more particularly to a semiconductor device having an epitaxial source/drain (S/D) structure with voids and its manufacturing process. As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Disclosed embodiments relate to a semiconductor device and its manufacturing method, in particular, source/drain regions of a field effect transistor (FET). The embodiments such as those disclosed herein are generally applicable not only to FinFETs but also other FETs.

Figure 1:
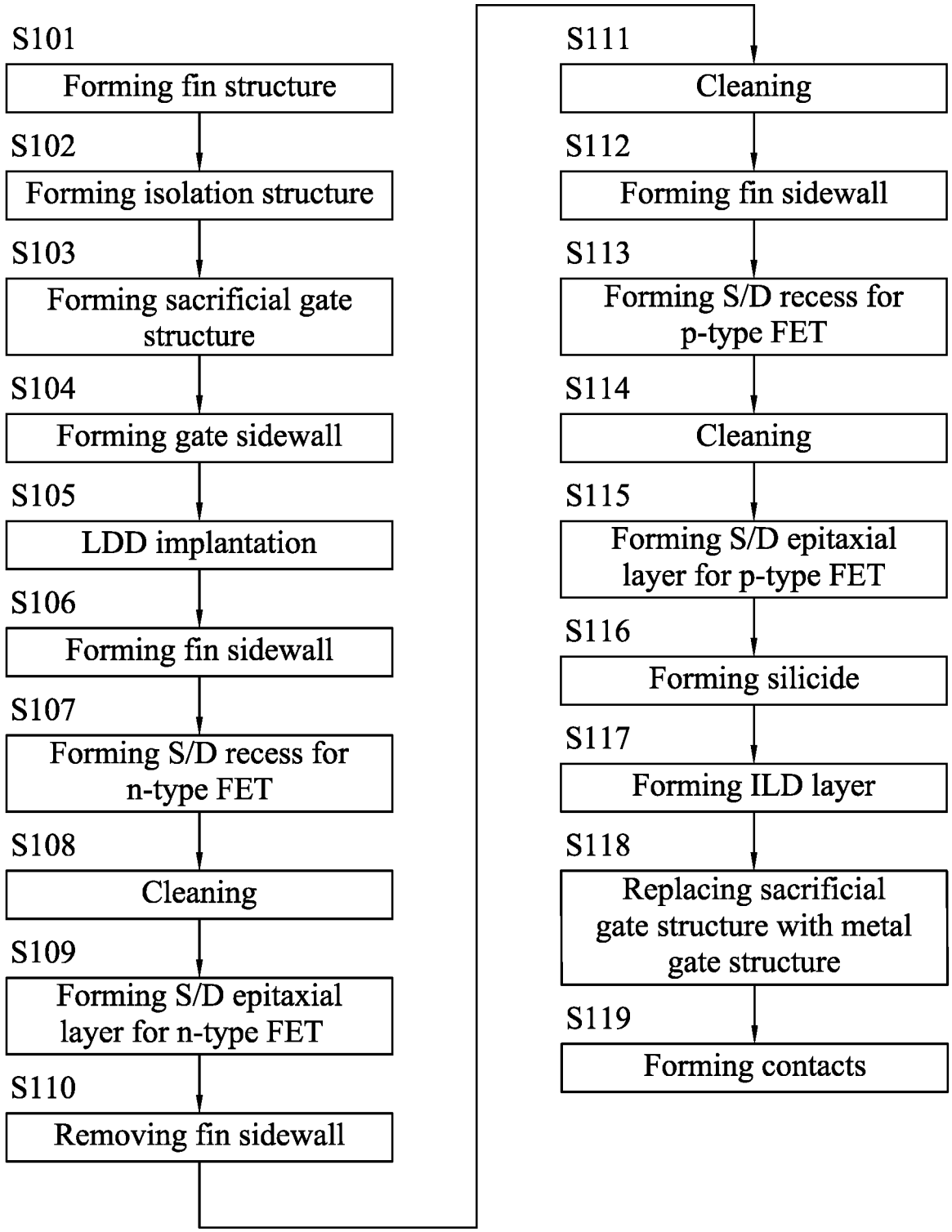
FIG. 1 shows a process flow chart of a manufacturing operation for a semiconductor device according to an embodiment of the present disclosure.

FIG. 1 shows a process flow chart and FIGS. 2-16 show cross sectional views of various stages for manufacturing a semiconductor device according to embodiments of the present disclosure. It is understood that additional operations can be provided before, during, and after processes shown by FIGS. 1 and 2-16, and some of the operations described below can be replaced or eliminated, for additional embodiments of the method. The order of the operations/processes may be interchangeable.

Figure 2:
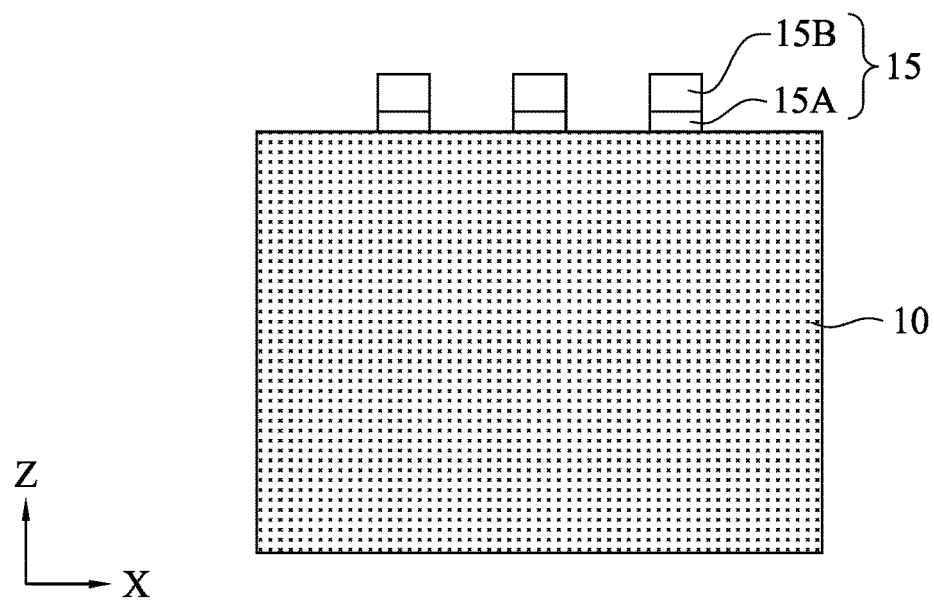
FIG. 2 shows a cross sectional view of one of the various stages of a manufacturing operation for a semiconductor device according to an embodiment of the present disclosure.
Figure 3:
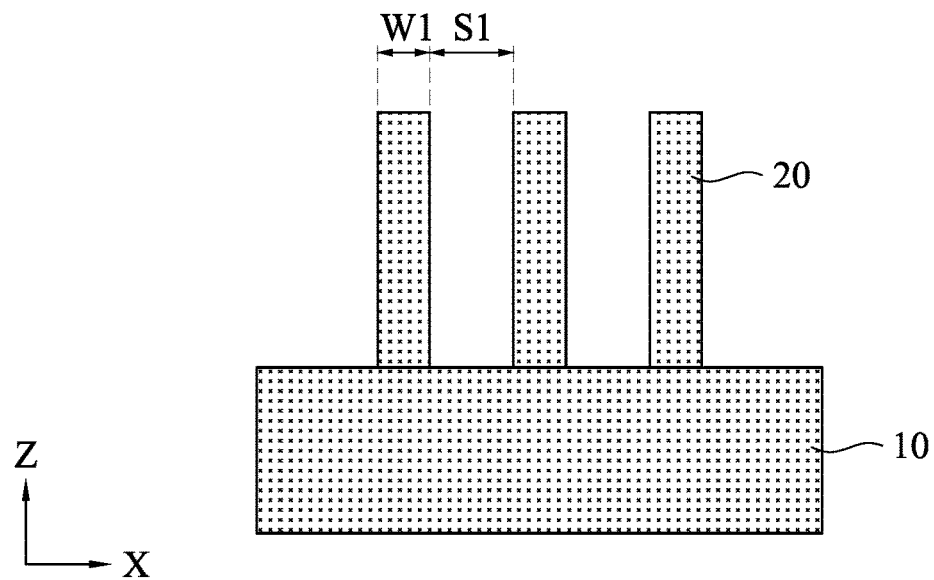
FIG. 3 shows a cross sectional view of one of the various stages of a manufacturing operation for a semiconductor device according to an embodiment of the present disclosure.

In S101 of FIG. 1 and as shown in FIGS. 2 and 3, one or more fin structures 20 are formed over a substrate 10. Fin structures for FinFETs can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. The multi-patterning processes combining photolithography and self-aligned processes generally result in forming a pair of fin structures.

In some embodiments, a mask layer 15 is formed over a substrate 10 to fabricate fin structures. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ $cm^{-3}$ to about $1 \times 10^{16}$ $cm^{-3}$. In other embodiments, the substrate is an n-type silicon or germanium substrate with an impurity concentration in a range from about $1 \times 10^{15}$ $cm^{-3}$ to about $1 \times 10^{16}$ $cm^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments. The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 2.

Then, as shown in FIG. 3, by using the hard mask pattern 15 as an etching mask, the substrate 10 is patterned into fin structures 20 by trench etching using a dry etching method and/or a wet etching method.

In FIG. 3, three fin structures 20 are disposed over the substrate 10. However, the number of the fin structures is not limited to three. The numbers may be as small as one or more than three. In some embodiments, the number of fin structures is in a range from 5 to 1000, which are connected by a source/drain epitaxial layer formed in subsequent operations. In other embodiments, the number of fin structures is in a range from 5 to 100, which are connected by source/drain epitaxial layers formed in subsequent operations. In certain embodiments, the number of fin structures is in a range from 5 to 20, which are connected by source/drain epitaxial layers formed in subsequent operations. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 3 nm to about 40 nm in some embodiments, and is in a range from about 7 nm to about 12 nm in other embodiments. The space S1 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 6A) may be referred to as a well region, and the upper part of the fin structure 20 may be referred to as a channel region. Under the gate structure 40, the well region is embedded in the isolation insulating layer 30 (see, FIG. 6A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 4:
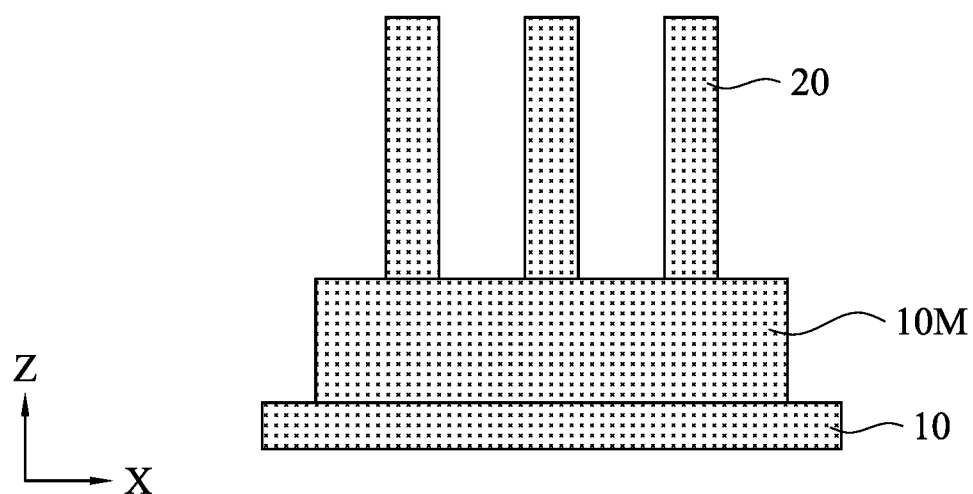
FIG. 4 shows a cross sectional view of one of the various stages of a manufacturing operation for a semiconductor device according to an embodiment of the present disclosure.

After the fin structures 20 are formed, the substrate 10 is further etched to form a mesa shape 10M in some embodiments, as shown in FIG. 4. In other embodiments, the mesa shape 10M is first formed, and then the fin structures 20 are formed. In certain embodiments, no mesa shape is formed.

After the fin structures 20 and the mesa shape 10M is formed, at S102 of FIG. 1, an isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous.

Figure 5:
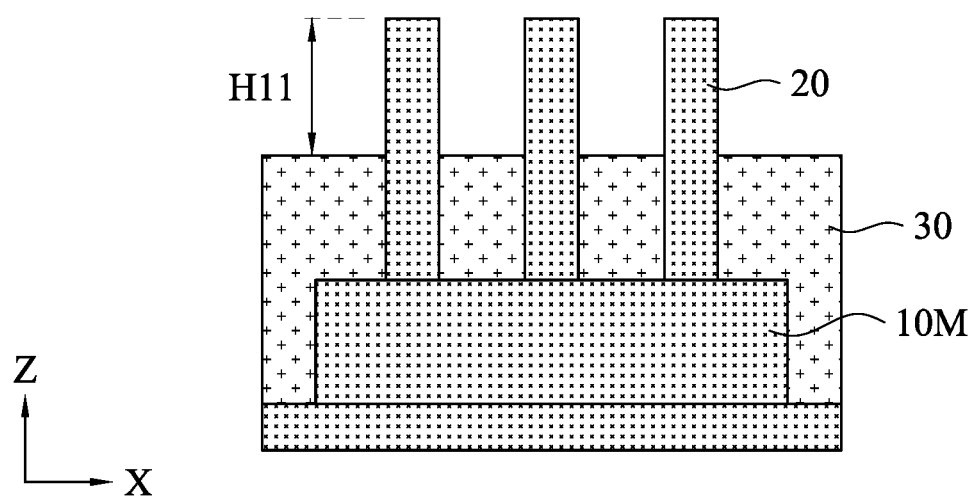
FIG. 5 shows a cross sectional view of one of the various stages of a manufacturing operation for a semiconductor device according to an embodiment of the present disclosure.

The insulating layer 30 is first formed in a thick layer so that the fin structures are embedded in the thick layer, and the thick layer is recessed so as to expose the upper portions of the fin structures 20 as shown in FIG. 5. The height H11 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 6A:
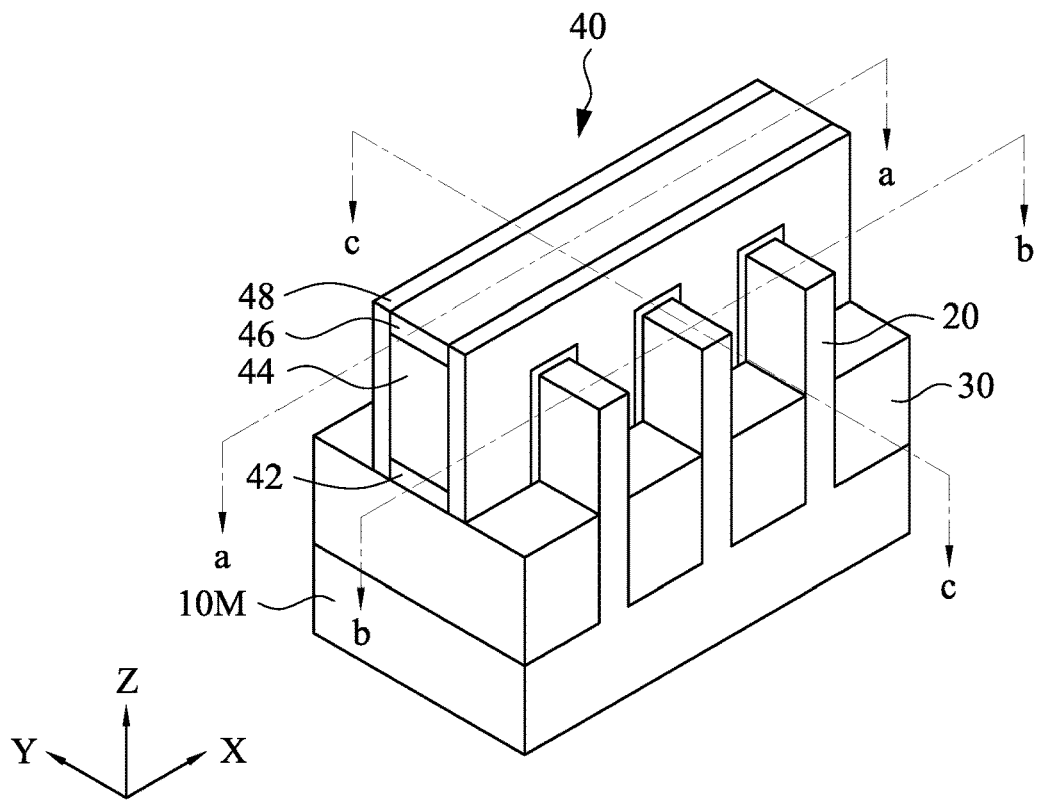
FIGS. 6A, 6B and 6C show views of one of the various stages of a manufacturing operation for a semiconductor device according to an embodiment of the present disclosure.
Figure 6B:
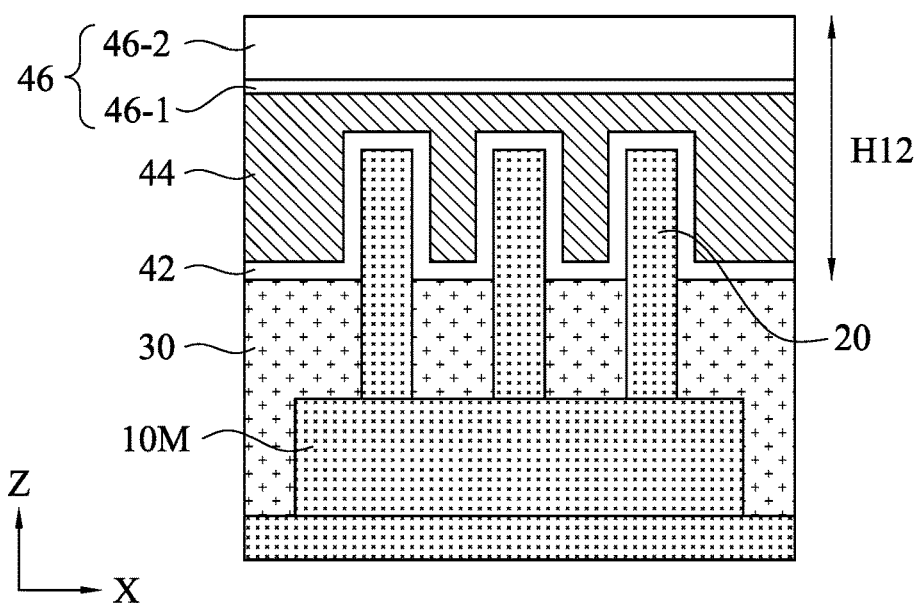
Figure 6C:
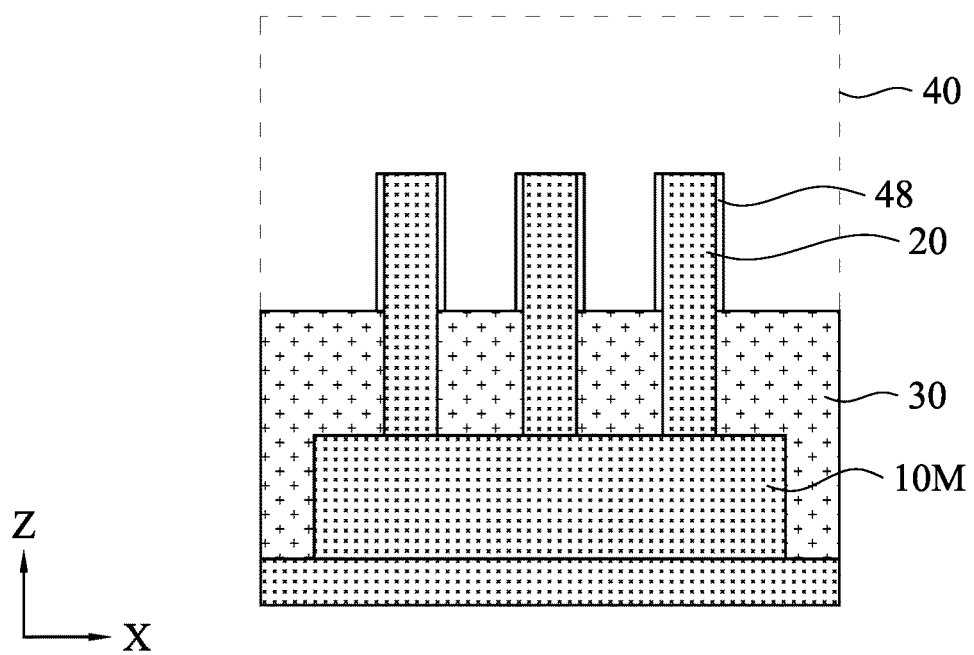

After the insulating layer 30 is formed, at S103 of FIG. 1, a sacrificial gate structure 40 is formed over the fin structures 20, as shown in FIGS. 6A-6C. FIG. 6A is an exemplary perspective view, FIG. 6B is an exemplary cross sectional view along line a-a of FIG. 6A and FIG. 6C is an exemplary cross sectional view along line b-b of FIG. 6A. FIGS. 7, 8A, 10A and 11-20 are also cross sectional views along line b-b of FIG. 6A. FIGS. 8B and 10B are cross sectional views along line c-c of FIG. 6A.

As shown in FIG. 6A, the sacrificial gate structure 40 extends in the X direction, while the fin structures 20 extend in the Y direction. To fabricate the sacrificial gate structure 40, a dielectric layer and a poly silicon layer are formed over the isolation insulating layer 30 and the exposed fin structures 20, and then patterning operations are performed so as to obtain sacrificial gate structures including a sacrificial gate pattern 44 made of poly silicon and a sacrificial dielectric layer 42. In some embodiments, the polysilicon layer is patterned by using a hard mask and the hard mask remains on the gate pattern 44 as a hard mask layer 46. The hard mask layer 46 includes one or more layers of insulating material. The hard mask layer 46 includes a silicon oxide layer 46-2 formed over a silicon nitride layer 46-1 in some embodiments. In other embodiments, the hard mask layer 46 includes a silicon nitride layer formed over a silicon oxide layer. The insulating material for the hard mask layer 46 may be formed by CVD, PVD, ALD, e-beam evaporation, or other suitable process. In some embodiments, the sacrificial dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H12 of the sacrificial gate structures is in a range from about 50 nm to about 400 nm in some embodiments, and is in a range from about 100 nm to 200 nm in other embodiments.

Further, at S104 of FIG. 1, gate sidewall spacers 48 are formed on both sidewalls of the sacrificial gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material followed by post anisotropic etching. In one embodiment, the sidewall spacer layers 48 are made of silicon nitride based material, such as SiN, SiON, SiOCN or SiCN. In some embodiments, the sidewall spacers 48 are also formed on sidewalls of the exposed fin structures 20 as shown in FIG. 6C.

In some embodiments, at S105 of FIG. 1, one or more ion implantation operations are performed to implant ions into the source/drain region of the fin structure, before and/or after the gate sidewall spacers 48, to form a lightly doped drain (LDD) structure.

Figure 7:
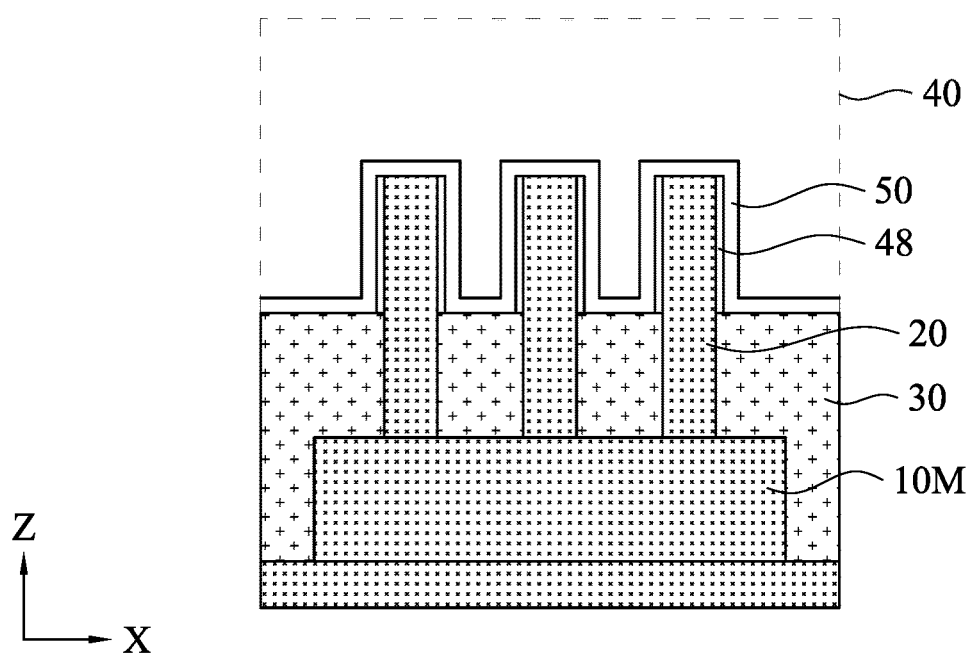
FIG. 7 shows a cross sectional view of one of the various stages of a manufacturing operation for a semiconductor device according to an embodiment of the present disclosure.

Then, as shown in FIG. 7, at S106 of FIG. 1, a fin mask layer 50 (fin sidewall) is formed over the fin structures 20. The fin mask layer 50 is made of dielectric material including silicon nitride based material, such as SiN, SiON, SiOCN or SiCN. In one embodiment, SiN is used as the fin mask layer 50. The fin mask layer 50 is formed by CVD, PVD, ALD, e-beam evaporation, or other suitable process.

The thickness of the fin mask layer 50 is in a range from about 3 nm to about 30 nm in some embodiments.

After forming the fin mask layer 50, at S107 of FIG. 1, the upper portion of the fin structures 20 are recessed and a part of the fin mask layer 50 and the sidewall spacers 48 are removed by a dry etching and/or a wet etching operation. The upper portion of the fin structures 20 are recessed (etched) down to the level equal to or below the upper surface of the fin mask layer 50 on the upper surface of the isolation insulating layer 30, as shown in FIG. 8A.

In some embodiments, the recess 22 is formed separately for an n-type FET and a p-type FET. In some embodiments, the recess 22 (and the subsequent epitaxial layer) for an n-type FET is first formed while the region for a p-type FET is covered by a cover layer 49 (e.g., silicon nitride) (see, FIG. 9B), and then the recess 22 (and the subsequent epitaxial layer) for the p-type FET is formed while the region for the n-type FET is covered by a cover layer (see, at S113 and S114 of FIG. 1).

Figure 8A:
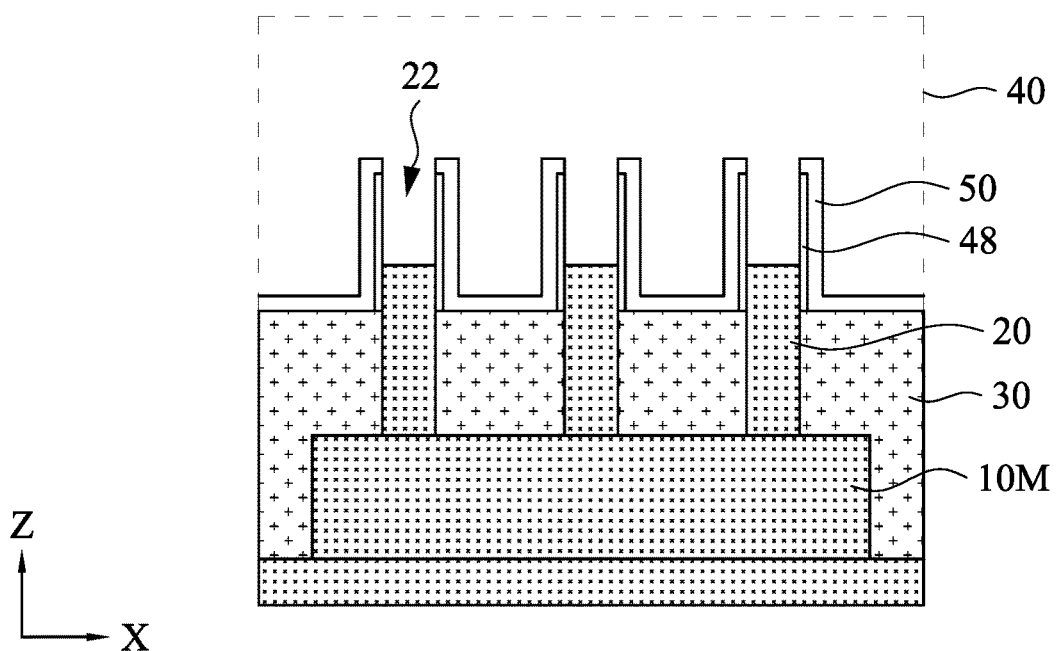
FIGS. 8A and 8B show cross sectional views of one of the various stages of a manufacturing operation for a semiconductor device according to an embodiment of the present disclosure.
Figure 8B:
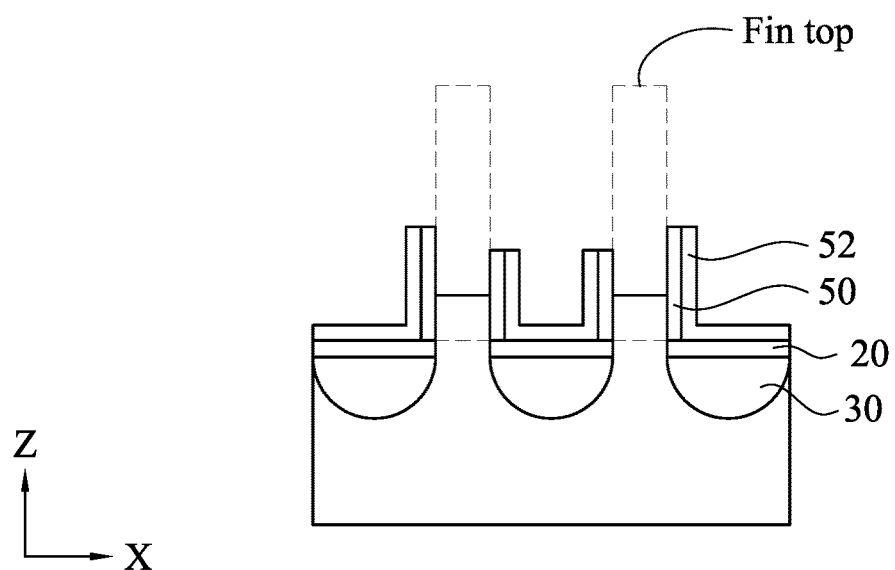

In some embodiments, the top of the recessed fin structure 20 (the bottom of the recess 22) is located above the upper surface of the isolation insulating layer 30, as shown in FIG. 8A. In other embodiments, the top of the recessed fin structure 20 (the bottom of the recess 22) is located at the same level as or lower than the upper surface of the isolation insulating layer 30.

In some embodiments, depending on the space between adjacent two fin structure and a space between the adjacent two fin structures and another fin structure, the etching of the fin mask layer 50 and the sidewall spacer 48 is asymmetric with respect to the fin structure as shown in FIG. 8B. FIG. 8B also shows a fin structure before recessing (or under the sacrificial gate structure). In some embodiments, the remaining fin mask layer 50 and sidewall spacer 48 of one of the two adjacent fin structures on the side facing the other fin structure has a lower height than the remaining fin mask layer 50 and sidewall spacer 48 of one of the two adjacent fin structure located on the other side. In other embodiments, the height relationship is opposite.

In some embodiments, the upper surface of the recessed fin structure 20 has a U-shape, a W-shape or a wavy shape.

At S109 of FIG. 1, an epitaxial source/drain structure for an n-type FET is formed over the recessed fin structures 20. The epitaxial source/drain structure is made of one or more layers of semiconductor material having a different lattice constant than the fin structures 20 (channel regions). In FIGS. 9A-13B and 16A-16B, the "A" figures show cross sectional views along the X direction (gate extending direction), and the "B" figures show cross sectional views along the Y direction (fin extending direction).

Figure 9A:
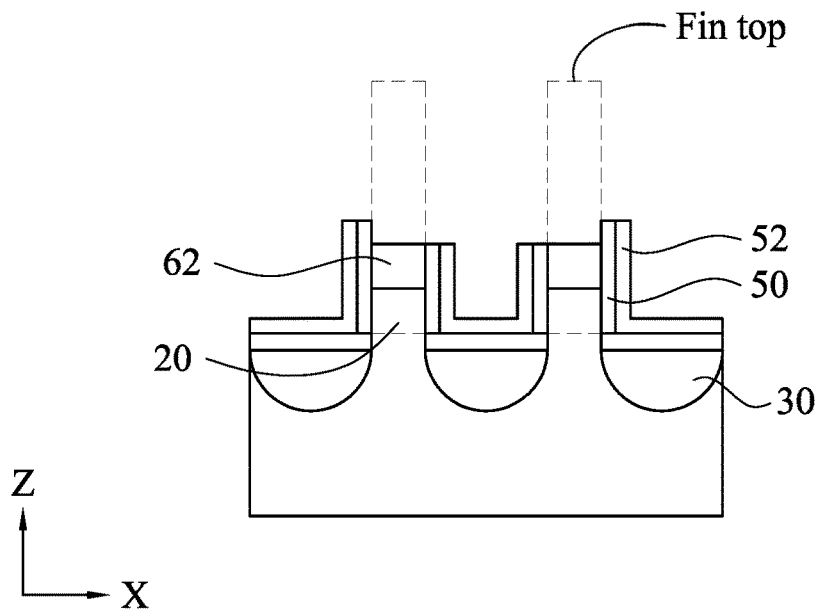
FIGS. 9A and 9B show cross sectional views of one of the various stages of a manufacturing operation for a semiconductor device according to an embodiment of the present disclosure.
Figure 9B:
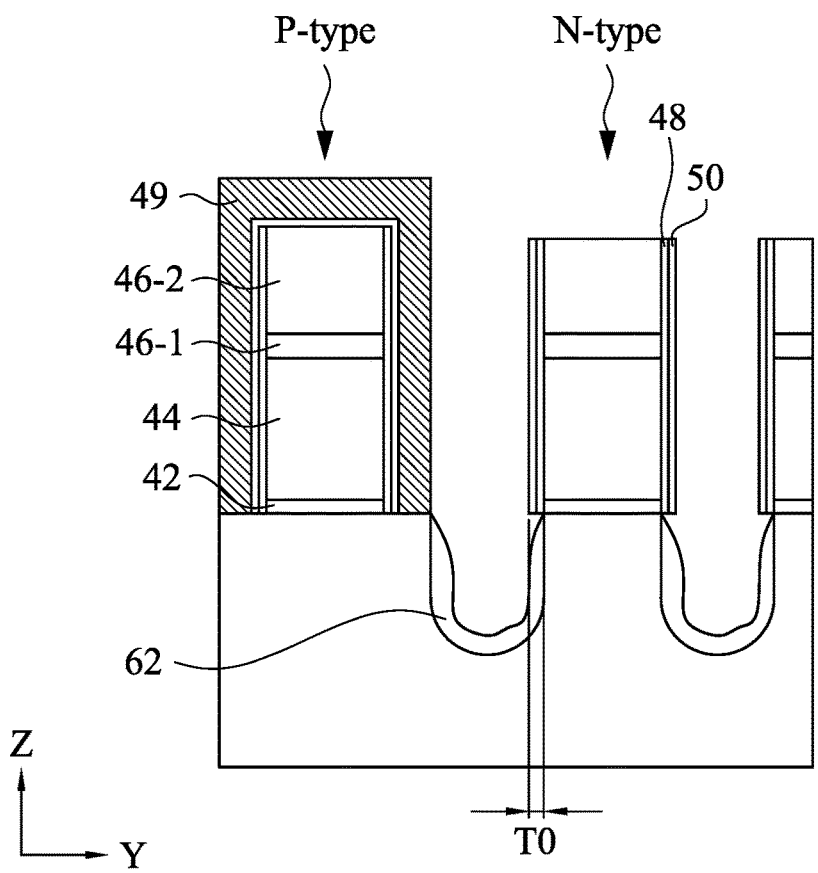

In some embodiments, as shown in FIGS. 9A and 9B, a first epitaxial layer 62 is formed over the recessed fin structure 20. In some embodiments, the first epitaxial layer 62 includes SiAs and/or SiGeAs, which can suppress phosphorous (P) diffusion from the subsequently formed second epitaxial layer to the channel region of the fin structure. In some embodiments, an As concentration in the first epitaxial layer 62 is in a range from about $5 \times 10^{19}$ atoms/cm$^3$ to about $5 \times 10^{21}$ atoms/cm$^3$, and is in a range from about $1 \times 10^{20}$ atoms/cm$^3$ to about $2 \times 10^{21}$ atoms/cm$^3$ in other embodiments. If the As concentration is too low, a diffusion barrier effect against P is insufficient. It is difficult to include As more than the upper limit of the range, and the high As concentration would diminish stress applied to the channel and increase resistance. In other embodiments, SiGe doped with P is used as the first epitaxial layer 62.

In some embodiments, the thickness T0 of the first epitaxial layer 62 is in a range from about 3 nm to about 20 nm, and is in a range from about 10 nm to about 15 nm in other embodiments. If the thickness T0 is too small, a diffusion barrier effect against P is insufficient, and if the thickness is too high, it would diminish stress applied to the channel and increase resistance. In some embodiments, the first epitaxial layer 62 is deposited up to the level equal to or slightly below (less than 2 nm) the bottom of the gate sidewall spacers 48.

In some embodiments, the epitaxial growth of the first epitaxial layer 62 includes one or more deposition phases and one or more etching phases to control the shape of the epitaxial layer. The deposition and etching phases may be alternatively performed. In some embodiments, the substrate 10 is a (100) Si substrate. The SiAs first epitaxial layer grows along the (100) face faster than the (110) and (111) faces. Whereas, post etching the SiAs first epitaxial layer 62 forms the facet of (111) at the top and etches faster along the (110) and (111) directions than the (100) direction. Accordingly, there is a difference in thickness between the bottom and side of the first epitaxial layer in some embodiments. In some embodiments, the bottom thickness is greater than the side thickness, and the difference between the thickness of bottom (along vertical or Z direction) and the thickness along the channel side (along the Y direction) is in a range from about 5 nm to about 10 nm.

After the first epitaxial layer 62 is formed, the second epitaxial layer 64 including a lower layer 64-1 and an upper layer 64-2 is formed on the first epitaxial layer, as shown in FIGS. 10A, 10B, 11A and 11B. In some embodiments, the second epitaxial layer 64 includes SiP, or SiCP.

In some embodiments, a phosphorous (P) concentration in the second epitaxial layer 64 is in a range from about $2 \times 10^{20}$ atoms/cm$^3$ to about $1 \times 10^{22}$ atoms/cm$^3$, and is in a range from about $5 \times 10^{20}$ atoms/cm$^3$ to about $5 \times 10^{21}$ atoms/cm$^3$ in other embodiments. If the P concentration is too low, the resistance of the second epitaxial layer increases, and if the P concentration is too high, the stress applied to the channel is diminished.

Figure 10A:
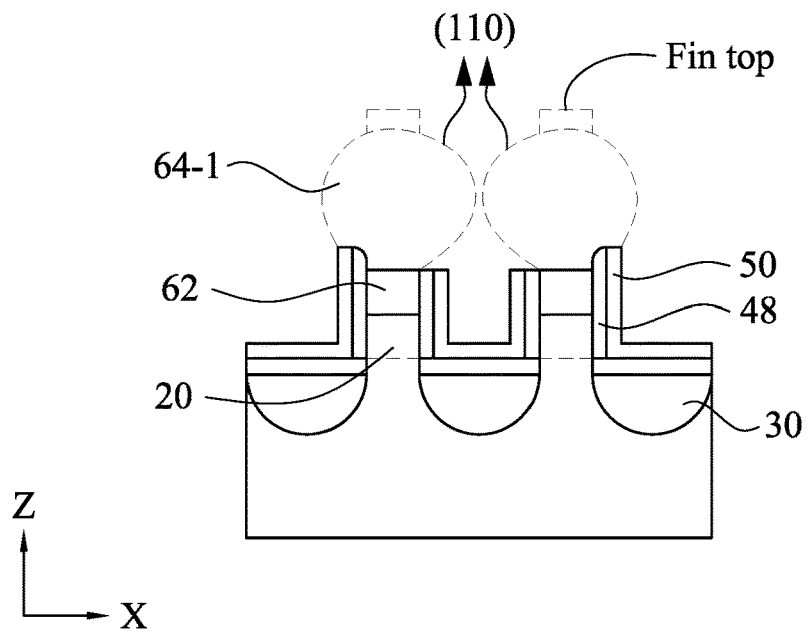
FIGS. 10A and 10B show cross sectional views of one of the various stages of a manufacturing operation for a semiconductor device according to an embodiment of the present disclosure.
Figure 10B:
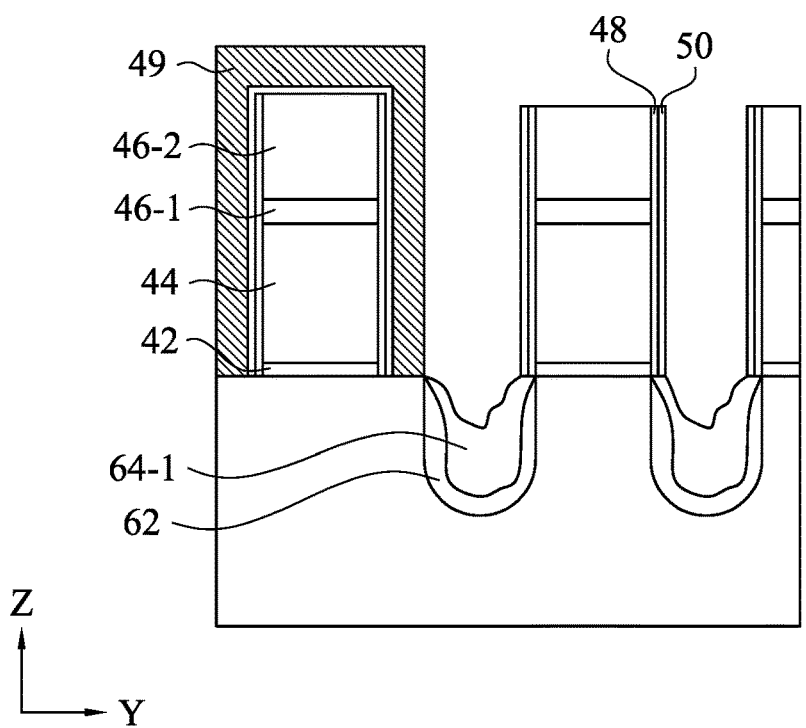

As shown in FIGS. 10A and 10B, the lower layer 64-1 is grown substantially symmetric with respect to the respective fin structures. In some embodiments, the epitaxial growth of the lower epitaxial layer 64-1 includes one or more deposition phases and one or more etching phases to control the shape of the epitaxial layer, which may be alternatively performed. After the last etching phase, the (110) facet is formed on the top of the lower layer 64-1 in some embodiments. As shown in FIG. 10A, the lower layer 64-1 of the second epitaxial layer does not merge with the lower layer 64-1 over the adjacent fin structure.

Figure 11A:
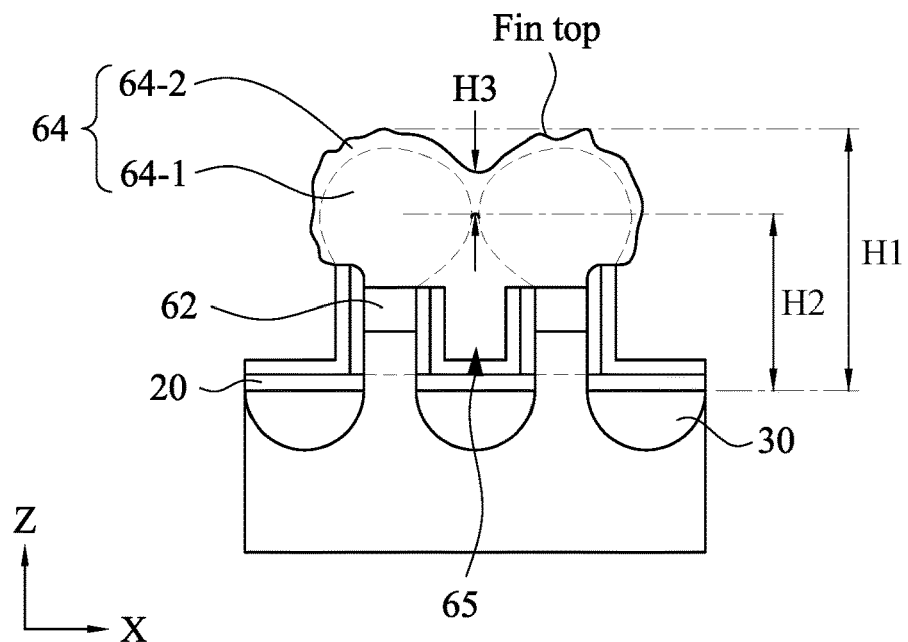
FIGS. 11A and 11B show cross sectional views of one of the various stages of a manufacturing operation for a semiconductor device according to an embodiment of the present disclosure.
Figure 11B:
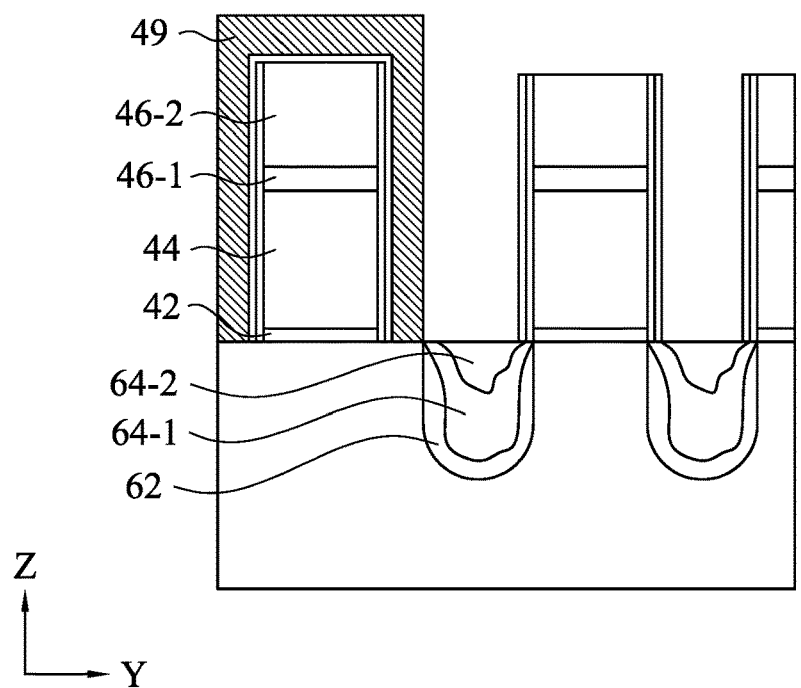

Then, as shown in FIGS. 11A and 11B, the upper layer 64-2 is formed such that the second epitaxial layers of the adjacent fin structures merge with each other by the upper layer 64-2. As shown in FIG. 11A, the merger point is located at a relatively high level from the surface of the isolation insulating layer 30. When the fin height (under the sacrificial gate structure) from the upper surface of the isolation insulating layer is H1, the height H2 of the bottom of the merger point is in a range from about 0.5H1 to about 0.8H1 in some embodiments and in other embodiments, is in a range from about 0.65H1 to 0.75H1. The thickness H3 of the upper layer 64-2 at the merger point is in a range from about 7 nm to about 30 nm in some embodiments. As shown in FIG. 11A, a gap 65 is formed under the merger point. After the upper layer 64-2 is formed, the upper surface of the second epitaxial layer 64 has a wavy shape having an unevenness (peak-to-valley) in a range from about 2 nm to about 10 nm in the Z direction in some embodiments.

In some embodiments, the P concentration in the lower layer 64-1 is the same as or different from the P concentration in the upper layer 64-2. In some embodiments, after the etching phase of the lower layer 64-1 is performed, the upper layer 64-2 is formed. During the formation of the upper layer 64-2, no etching phase is included. The thickness of the second epitaxial layer along the Z direction is in a range from about 10 nm to about 50 nm in some embodiments. In some embodiments, the second epitaxial layer 64 is deposited up to the level equal to or slightly below (less than 2 nm) the bottom of the gate sidewall spacers 48. In other embodiments, the second epitaxial layer 64 is deposited slightly above (less than 2 nm) the top of the fin structure 20 under the sacrificial gate structure. In some embodiments, a thickness ratio of the upper layer 64-2 to the lower layer 64-1 along the vertical direction over the fin structure is in a range from about 0.1 to about 0.3.

Figure 12A:
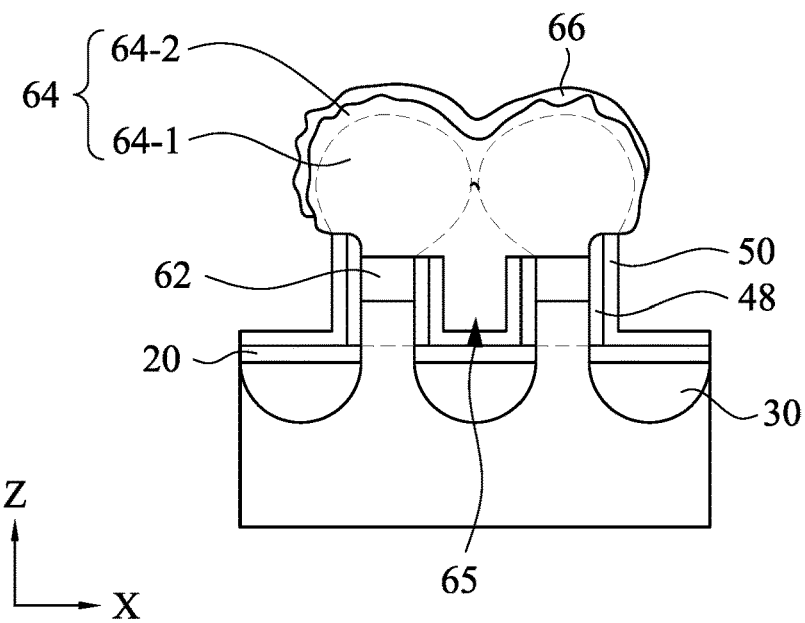
FIGS. 12A and 12B show cross sectional views of one of the various stages of a manufacturing operation for a semiconductor device according to an embodiment of the present disclosure.
Figure 12B:
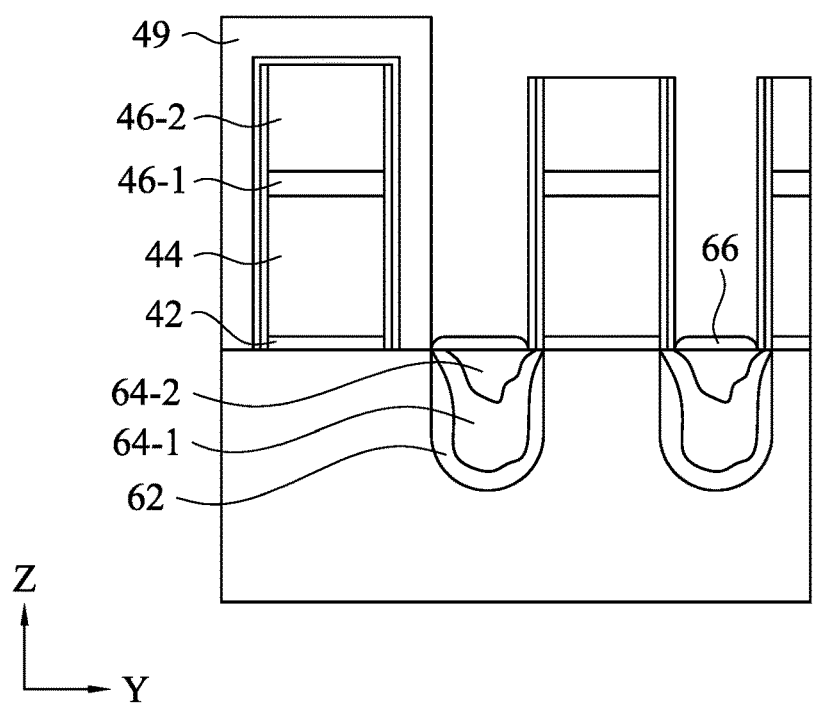

Then, as shown in FIGS. 12A and 12B, a third epitaxial layer 66 is formed on the second epitaxial layer 64. In some embodiments, the third epitaxial layer 66 includes SiP, or SiCP. In some embodiments, the third epitaxial layer 66 further contain Ge to reduce contact resistance for a subsequently formed source/drain contact.

Figure 13A:
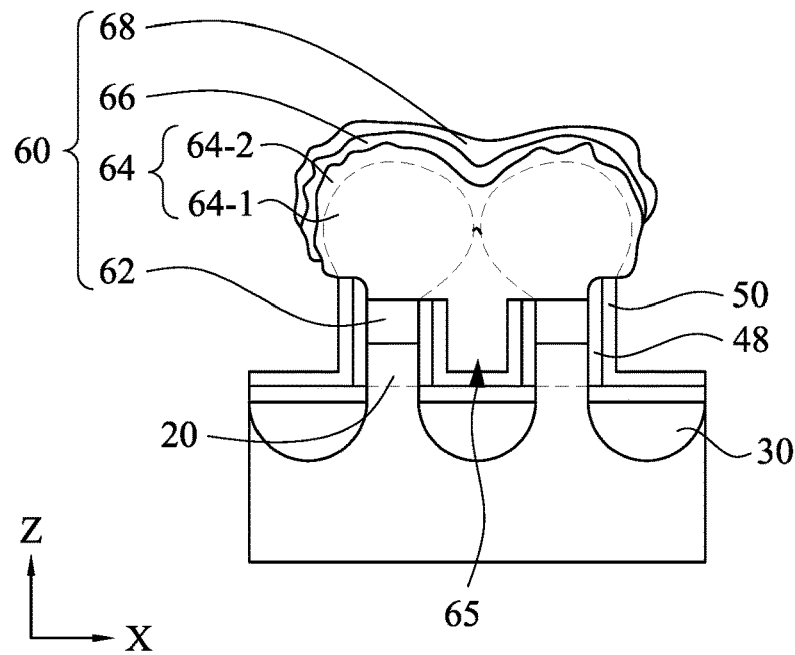
FIGS. 13A and 13B show cross sectional views of one of the various stages of a manufacturing operation for a semiconductor device according to an embodiment of the present disclosure.
Figure 13B:
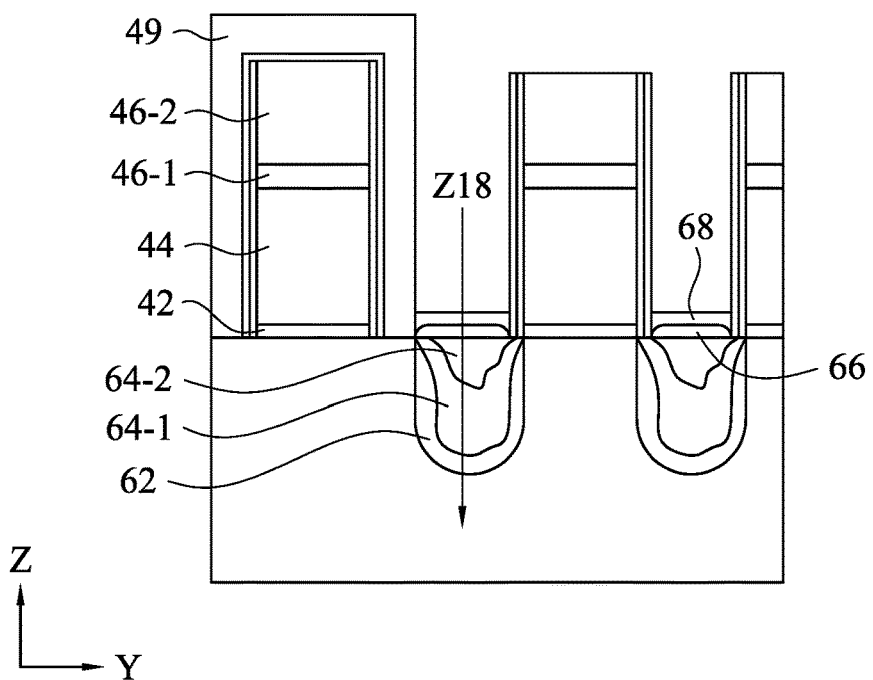

In some embodiments, a phosphorous (P) concentration in the third epitaxial layer 66 is equal to or smaller than that in the second epitaxial layer 64, and is in a range from about $2 \times 10^{20}$ atoms/cm3 to about $1 \times 10^{22}$ atoms/cm3, and is in a range from about $5 \times 10^{20}$ atoms/cm3 to about $5 \times 10^{21}$ atoms/cm3 in other embodiments. If the P concentration is too low, a resistance of the second epitaxial layer increases, and if the P concentration is too high, it would diminish stress applied to the channel. In some embodiments, a Ge concentration in the third epitaxial layer 66 is in a range from about 0.2 atomic % to about 10 atomic %, and is in a range from about 0.5 atomic % to about 5 atomic % in other embodiments. A small amount of Ge contributes TiSi formation and reduces contact resistance, and when the amount is too small, such an effect may not be obtained. When the Ge concentration is too high, it induces Ge agglomeration during TiSi formation and increases contact resistance and defects, and also diminishes stress in the epitaxial layers. In some embodiments, the epitaxial growth of the third epitaxial layer 66 includes one or more deposition phases and one or more etching phases that control the shape of the epitaxial layer, which may be alternatively performed. The thickness of the third epitaxial layer along the Z direction is in a range from about 5 nm to about 10 nm in some embodiments. If the thickness is too small, it would not get desired shape of the epitaxial layers. If the thickness is too large, it would induce merge with nearby devices either NFET or PFET and also diminishes wavy shape. In some embodiments, the third epitaxial layer 66 fully covers the surface of the second epitaxial layer 64 except for the gap 65, and touches the first epitaxial layer. In some embodiments, the first and third epitaxial layers sandwiching the second epitaxial layer suppress out-diffusion of phosphorous from the second epitaxial layer to the channel region or a metal gate electrode. Further, as shown in FIGS. 13A and 13B, a fourth epitaxial layer 68 as a cap layer is formed on the third epitaxial layer 66. In some embodiments, the fourth epitaxial layer 68 includes SiP, or SiCP. No Ge is included in the fourth epitaxial layer in some embodiments.

In some embodiments, a phosphorous (P) concentration in the fourth epitaxial layer 68 is equal to or different from that in the third epitaxial layer 66, and is in a range from about $2 \times 10^{20}$ atoms/cm$^3$ to about $1 \times 10^{22}$ atoms/cm$^3$, and is in a range from about $5 \times 10^{20}$ atoms/cm$^3$ to about $5 \times 10^{21}$ atoms/cm$^3$ in other embodiments. The thickness of the fourth epitaxial layer 68 along the Z direction is in a range from about 5 nm to about 10 nm in some embodiments. The fourth epitaxial layer 68 is grown mostly in the (100) direction, which maintains the (100) shape on the fin structure and the (110) shape between the fin structures. As shown in FIG. 13A, the first to fourth epitaxial layers are collectively referred to as a source/drain epitaxial layer (structure) 60.

Figure 14:
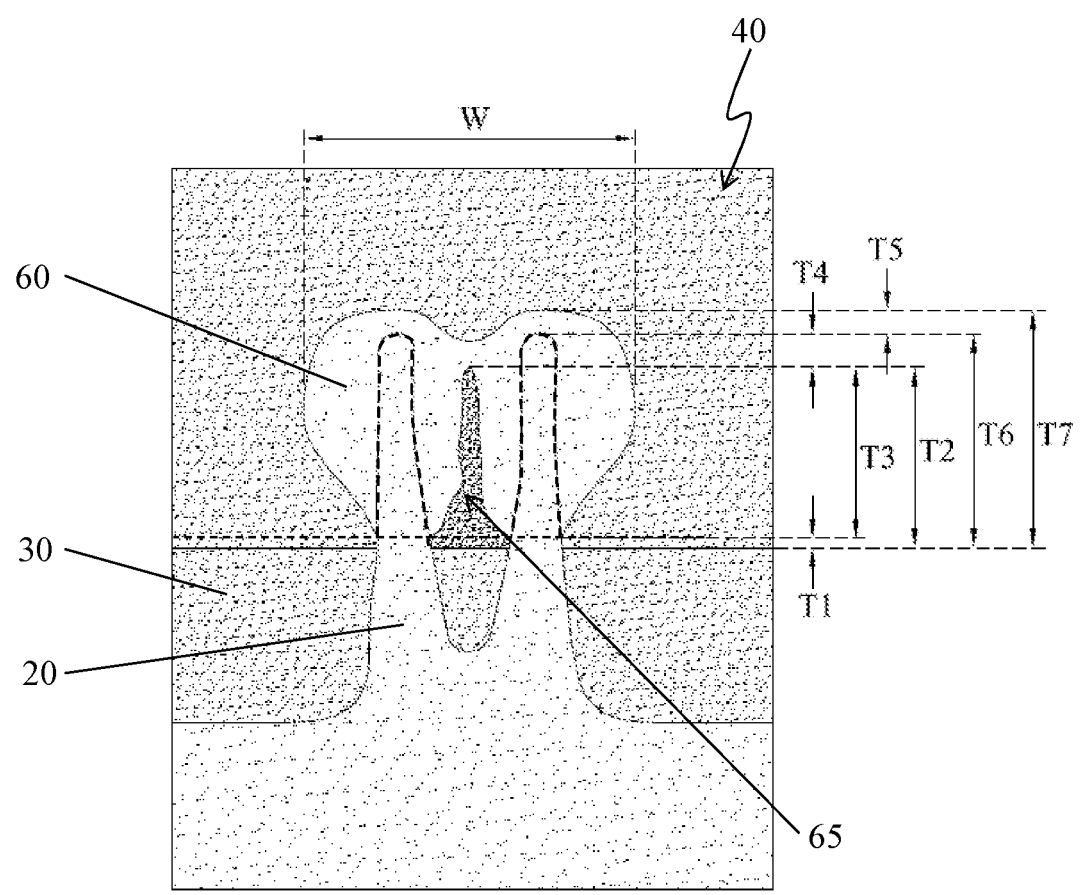
FIG. 14 shows a cross sectional view of one of the various stages of a manufacturing operation for a semiconductor device according to an embodiment of the present disclosure.

FIG. 14 shows a line drawing of a TEM image of the source/drain structure 60. Due to transmissive nature of TEM, a fin structure under the sacrificial gate is also seen. In FIG. 14, dimension T1 corresponds to the thickness of the first epitaxial layer 62 and is in a range from about 5 nm to about 20 nm in some embodiments. In some embodiments, the top of the first epitaxial layer 62 is located at about 80% to about 100% of the height of the fin mask layer 50 and/or the sidewall spacers 48 on the fin structure from the upper surface of the isolation insulating layer 30.

Dimension T2 is the height of the bottom of the merger point from the upper surface of the isolation insulating layer 30, and is in a range from about 20 nm to about 50 nm in some embodiments. In some embodiments, the merger point is located at or above 75% of the height T6 of the top of the fin structure under the sacrificial gate structure from the upper surface of the isolation insulating layer. The high merger point of the second epitaxial layer can improve a short channel effect.

Dimension T3 is a distance between the top of the first epitaxial layer and the bottom of the merger point. Dimension T4 is the thickness of the merger point. The merger point is defined at the center location of adjacent fin structures. In some embodiments, the thickness T4 is in a range from about 5 nm to about 20 nm depending on process and/or design requirements. If the thickness T4 is too small, a margin for a source/drain contact may be insufficient, if the thickness T4 is too thick, the top surface of the source/drain epitaxial layer may be flatter, which would increase contact resistance for the source/drain contact. Dimension T5 is the thickness of the source/drain epitaxial layer above the top of the fin structure, and is in a range from about 2 nm to about 10 nm in some embodiments. If the thickness T5 is too small, a margin for a source/drain contact may be insufficient, and if the thickness T5 is too thick, the top surface of the source/drain epitaxial layer may be flatter, which would increase contact resistance for the source/drain contact.

Dimension T6 is a fin (channel) height from the bottom of the first epitaxial layer (or the upper surface of the isolation insulating layer) to the top of the fin structure, and is in a range from about 40 nm to about 80 nm depending of process and/or design requirements. Dimension T7 is the total height of the source/drain epitaxial layer from the bottom of the first epitaxial layer (or the upper surface of the isolation insulating layer) to the top of the source/drain epitaxial layer, and is in a range from about 50 nm to about 90 nm depending on process and/or design requirements. In some embodiments, the ratio T4/T7 is in a range from about 0.1 to about 0.3 and is in a range from about 0.15 to about 0.25 in other embodiments. Dimension W is a total (maximum) width of the merged source/drain epitaxial layer 60, and is in a range from about 40 nm to about 80 nm depending on process and/or design requirements.

Figure 15:
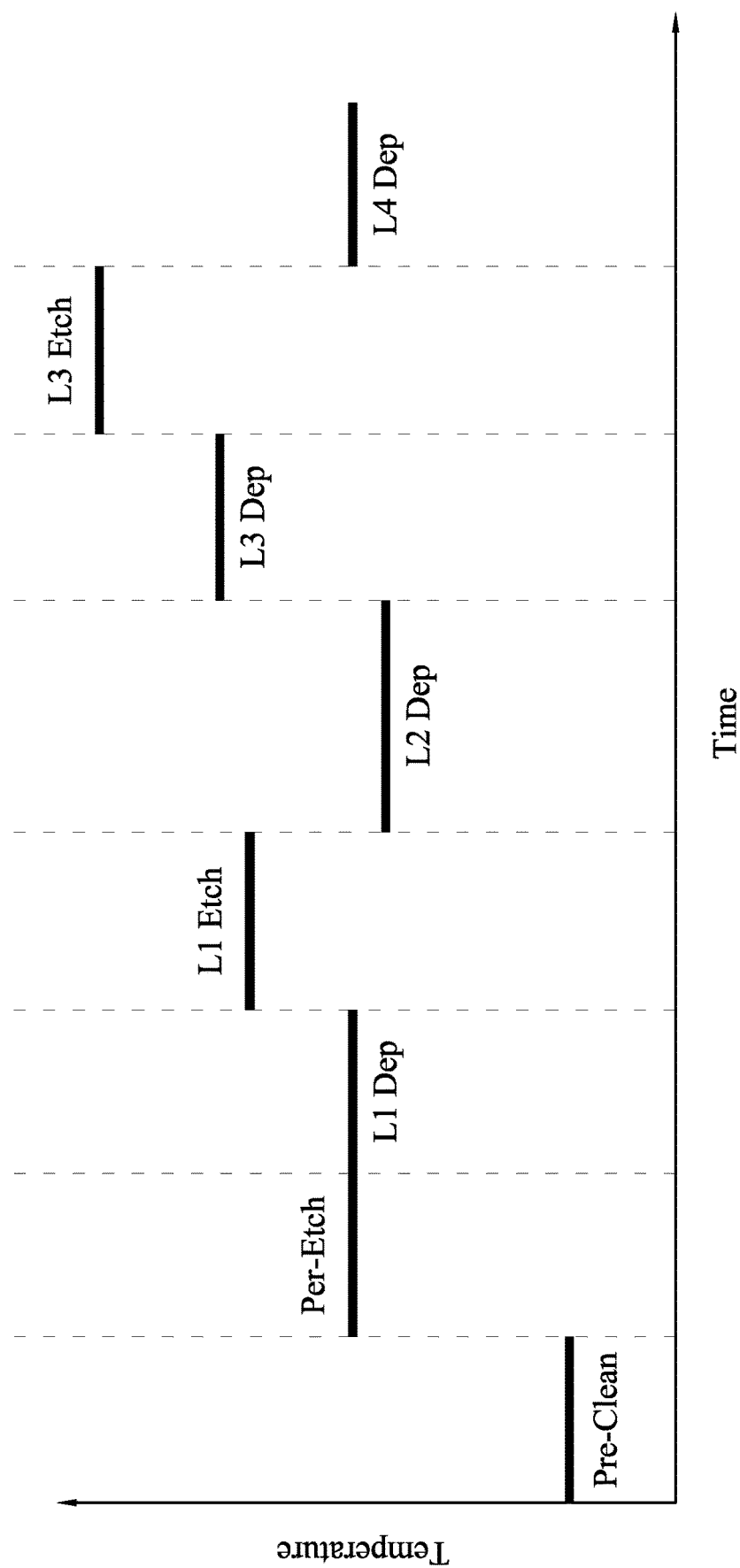
FIG. 15 shows a process flow of forming source/drain epitaxial layer according to an embodiment of the present disclosure.

FIG. 15 shows a process flow of forming the source/drain epitaxial layer 60 for an n-type FET according to embodiments of the present disclosure. After the source/drain region of the fin structure is recessed to form a source/drain space 22, a pre-clean operation is performed as shown in FIG. 15. In some embodiments, the pre-clean operation includes a plasma treatment using Ar and/or $NH_3$ plasma. The process temperature is in a range from about 300° C. to about 600° C. in some embodiments. Then, a pre-etching operation is performed to control the shape of the epitaxial layer subsequently formed, as shown in FIG. 15. In some embodiments, the pre-etching operation is performed in a $H_2$ and HCl gas ambient. The process temperature is higher than that of the pre-clean operation and is in a range from about 550° C. to about 750° C. in some embodiments.

Then, the first epitaxial layer 62 (indicated as L1 in FIG. 15) is formed by using a Si-containing gas, such as $SiH_4$, $Si_2H_6$ or $SiCl_2H_2$, and a dopant gas, such as $AsH_3$ or organic As, with $H_2$ as a carrier gas. The process temperature for forming the first epitaxial layer 62 is equal to or higher than that of the pre-etching operation, and is in a range from about 650° C. to about 750° C. in some embodiments. After the first epitaxial layer 62 is formed, an etching operation is performed to control the shape of the epitaxial layer. In some embodiments, the etching operation includes a plasma or dry treatment using $N_2$ and HCl gas. The process temperature is higher than the temperature of growth of the first epitaxial layer and is in a range from about 700° C. to about 800° C. in some embodiments.

After the first epitaxial layer 62 is formed and etched, a second epitaxial layer 64 (64-1 and 64-2) (indicated as L2 in FIG. 15) is formed. The process temperature for forming the second epitaxial layer 64 is lower than that of the L1 etching operation and that of forming the first epitaxial layer 62, and is in a range from about 600° C. to about 700° C. in some embodiments. The second epitaxial layer 64 is formed by using a Si-containing gas, such as $SiH_4$, $Si_2H_6$ or $SiCl_2H_2$, and a dopant gas, such as $PH_3$ or organic As, with $H_2$ or $N_2$ as a carrier gas.

In some embodiments, after the second epitaxial layer 64 is formed, a cleaning operation is optionally performed. The cleaning operation includes a chemical dry cleaning (etching) using $SiH_4$ and/or $GeH_4$ and HCl gases. The process temperature of the cleaning operation is lower than that of forming the first epitaxial layer 62 and higher that of forming the second epitaxial layer 64, and is in a range from about 650° C. to about 750° C. in some embodiments.

After the cleaning operation, a third epitaxial layer 66 (indicated as L3 in FIG. 15) is formed. The process temperature for forming the third epitaxial layer 66 is higher than that of forming the first and second epitaxial layers, and is in a range from about 650° C. to about 750° C. in some embodiments. The third epitaxial layer 66 is formed by using a Si-containing gas, such as $SiH_4$, $Si_2H_6$ or $SiCl_2H_2$, a Ge-containing gas, such as $GeH_4$ or $Ge_2H_6$, and a dopant gas, such as $PH_3$ or organic As, with $H_2$ or $N_2$ as a carrier gas. After the third epitaxial layer 66 is formed, an etching operation is performed to control the shape of the epitaxial layer. In some embodiments, the etching operation includes a plasma or dry treatment using $GeH_4$, $H_2$ and HCl gas. The process temperature is higher than the temperature of growth of the third epitaxial layer and is in a range from about 750° C. to about 800° C. in some embodiments. The L3 etching creates a V-shape between the fin structures.

Then, the fourth epitaxial layer 68 (indicated as L4 in FIG. 15) is formed by using a Si-containing gas, such as $SiH_4$, $Si_2H_6$ or $SiCl_2H_2$, and a dopant gas, such as $PH_3$ or organic As, with $H_2$ or $N_2$ as a carrier gas. The process temperature for forming the fourth epitaxial layer 68 is lower than that of the L3 etching operation and the L3 deposition, and is in a range from about 650° C. to about 750° C. in some embodiments.

After the epitaxial layer 60 for an n-type FET is formed, the fin mask layer and sidewall are removed in some embodiments, at S110 of FIG. 1. In other embodiments, the fin mask layer and sidewall spacers are not removed. In some embodiments, the cover layer covering the p-type region is also removed at S110 of FIG. 1, followed by a cleaning operation at S111 of FIG. 1.

Then, similar to the operation of S106, at S112 of FIG. 1, a fin mask layer (fin sidewall) for a p-type FET is formed, and then at S113 of FIG. 1, a recess is formed in the source/drain region of the fin structure for a p-type FET. The process for making the recess for a p-type FET is the same as or similar to the process for making the recess 22 for the n-type FET. At S114 of FIG. 1, a cleaning operation similar to that of S108 is performed.

Then, at S115 of FIG. 1, an epitaxial source/drain structure for a p-type FET is formed over the recessed fin structures 20. The epitaxial source/drain structure is made of one or more layers of semiconductor material having a different lattice constant than the fin structures 20 (channel regions). When the fin structures are made of Si, the epitaxial source/drain structure includes SiGe or Ge for a p-channel Fin FET. The epitaxial source/drain structure is epitaxially formed over the upper portions of the recessed fin structures. The source/drain epitaxial layer may be grown at a temperature of about 600 to 800° C. under a pressure of about 80 to 150 Torr, by using a Si-containing gas, such as $SiH_4$, $Si_2H_6$ or $SiCl_2H_2$; and a Ge-containing gas, such as $GeH_4$, $Ge_2H_6$ or $GeCl_2H_2$. In some embodiments, the source/drain epitaxial layer further includes boron.

Figure 16A:
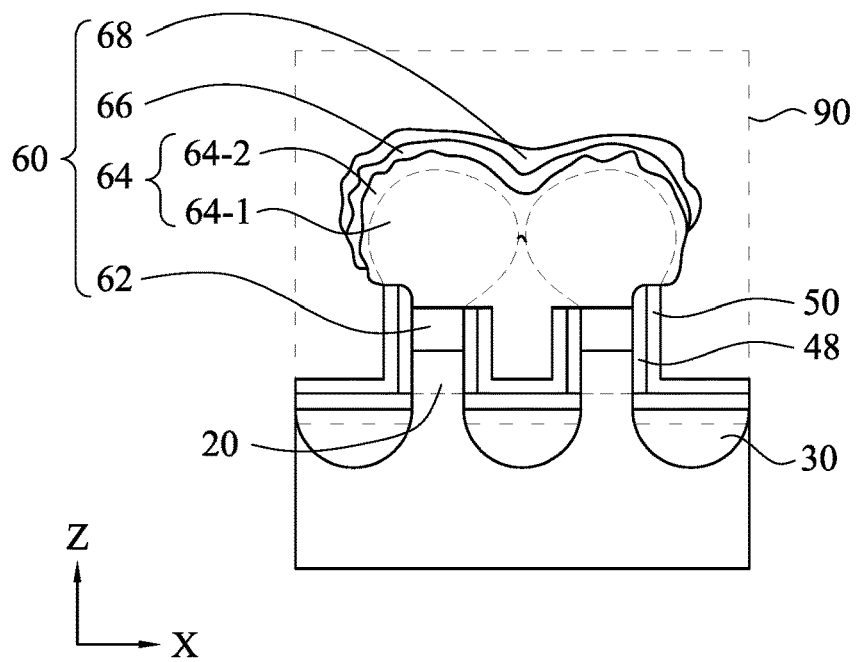
FIGS. 16A, 16B and 16C show cross sectional views of one of the various stages of a manufacturing operation for a semiconductor device according to an embodiment of the present disclosure.
Figure 16B:
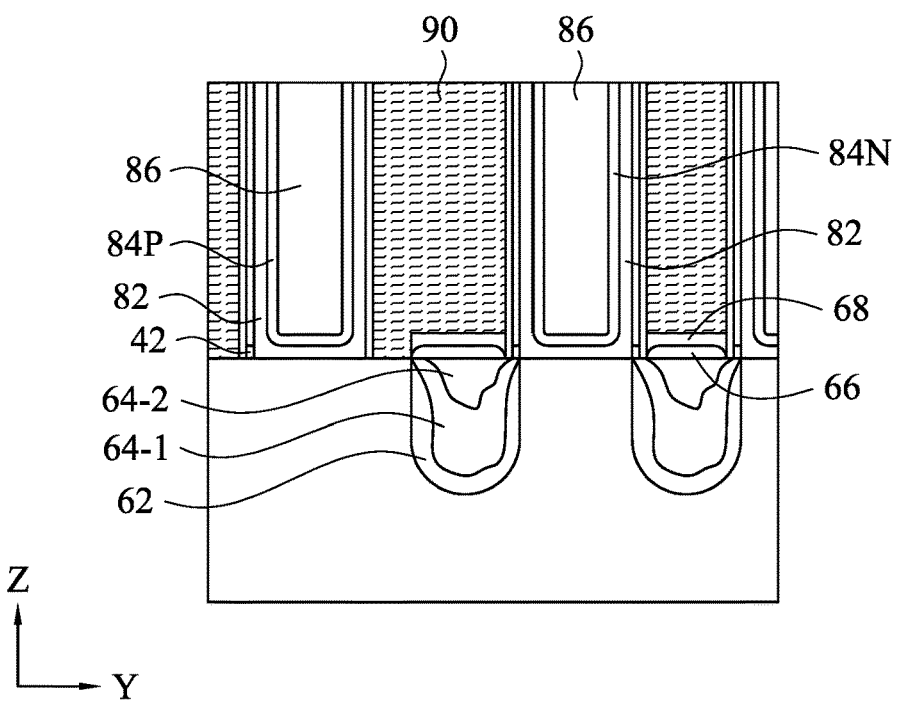
Figure 16C:
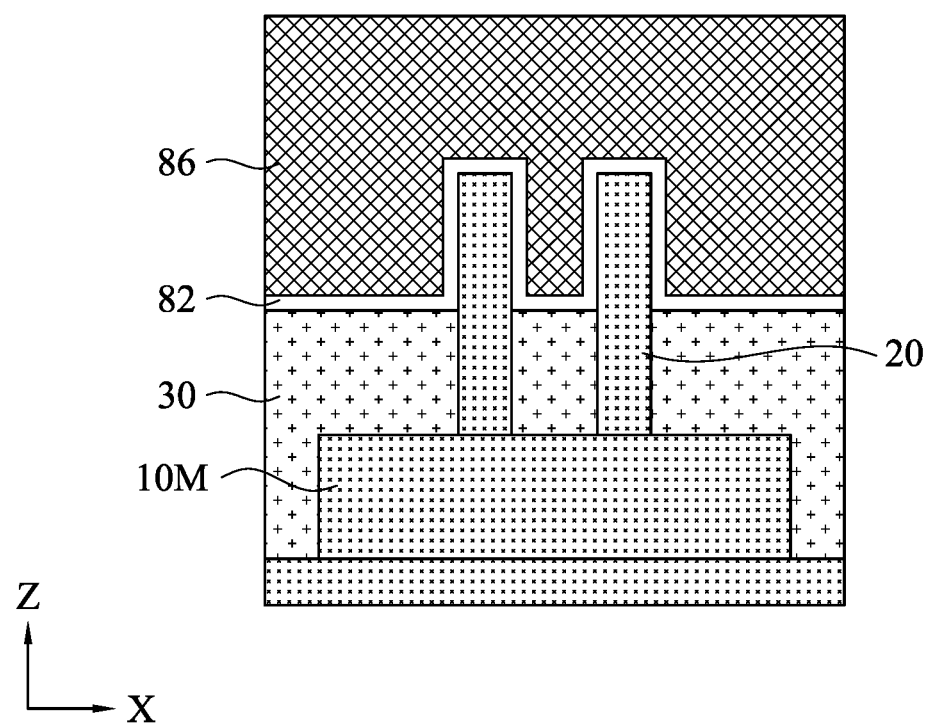

Then, at S117 of FIG. 1, as shown in FIGS. 16A, 16B and 16C, an insulating layer, functioning as a contact etching stop layer, is formed over the metal gate structure and the source/drain structures 60, and then an interlayer dielectric (ILD) layer 90 is formed. The ILD layer 90 is one or more layers of insulating material. In one embodiment, the etching stop layer is made of silicon nitride formed by CVD. The materials for the ILD layer 90 include compounds comprising Si, O, C and/or H, such as silicon oxide, SiCOH and SiOC. Organic materials, such as polymers, may be used for the ILD layer 90.

Then, at S118 of FIG. 1, a metal gate structure is formed by using a gate replacement technology. After forming the interlayer dielectric layer 90, a CMP operation is performed to expose the dummy gate electrode 44. The dummy gate structures (dummy gate electrode 44 and dummy gate dielectric layer 42) are then removed and replaced with a metal gate structure (metal gate electrode 86 and gate dielectric layer 82), as shown in FIGS. 16B and 16C.

The dummy gate electrode 44 and the dummy gate dielectric layer 42 are removed, by appropriate etching processes, respectively, to form a gate opening. Metal gate structures including the gate dielectric layer 82 and metal gate electrode 86 are formed in the gate openings.

The gate dielectric layer 82 is formed over an interface layer (not shown) disposed over the channel layer of the fin structures 20 in some embodiments. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer 82 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode 86 is formed over the gate dielectric layer. The metal gate electrode 86 includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers 84N, 84P are interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer 84N, and for the p-channel Fin FET, one or more of TiAlC, Al, TiAl, TaN, TaAlC, TiN, TiC and Co is used as the work function adjustment layer 84P.

After depositing appropriate materials for the metal gate structures, planarization operations, such as CMP, are performed.

Figure 17:
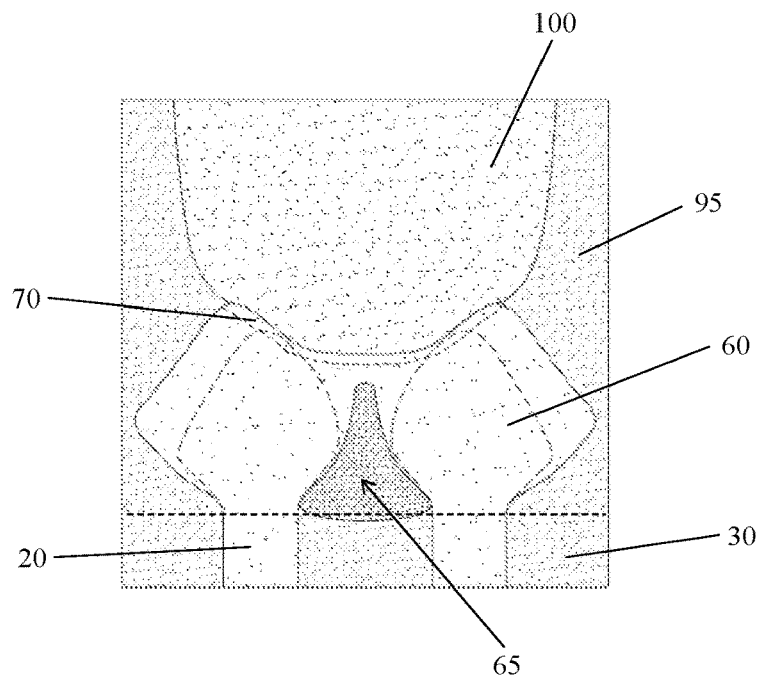
FIG. 17 shows a cross sectional view of one of the various stages of a manufacturing operation for a semiconductor device according to an embodiment of the present disclosure.

After the metal gate structure is formed, one or more interlayer dielectric layer is formed over the metal gate structure and the interlayer dielectric layer 90. The interlayer dielectric layers are collectively referred to as interlayer dielectric layer 95 as shown in FIG. 17. FIG. 17 shows a line drawing of a TEM image of the source/drain structure 60 and the source/drain contact.

At S119 of FIG. 1, by using a patterning operation including lithography, a contact hole is formed in the interlayer dielectric layer 95 so as to expose the epitaxial source and drain structures 60. Then, the contact hole is filled with a conductive material, thereby forming a contact plug 100, as shown in FIG. 17. The contact plug 100 may include a single layer or multiple layers of any suitable metal such as Co, W, Ti, Ta, Cu, Al and/or Ni and/or nitride thereof.

After forming the contact plug, further CMOS processes are performed to form various features such as additional interlayer dielectric layers, contacts/vias, interconnect metal layers, and passivation layers, etc.

In some embodiments, at S106 of FIG. 1, after the epitaxial source/drain structure 60 is formed, a silicide layer 70 (see, FIG. 17) is formed over the epitaxial source/drain structure 60 in some embodiments. A metal material, such as Ni, Ti, Ta and/or W, is formed over the epitaxial source/drain structure 60, and an annealing operation is performed to form a silicide layer 70. In other embodiments, a silicide material, such as NiSi, TiSi, TaSi and/or WSi, is formed over the epitaxial source/drain structure 60, and an annealing operation may be performed. The annealing operation is performed at a temperature of about 250° C. to about 850° C. The metal material or the silicide material is formed by CVD or ALD. The thickness of the silicide layer 70 is in a range from about 4 nm to about 10 nm in some embodiments. Before or after the annealing operations, the metal material or the silicide material formed over the isolation insulating layer 30 is selectively removed.

In other embodiments, the silicide layer 70 is formed after the contact hole is opened. In such a case, after forming the epitaxial source/drain structure 60, the metal gate structures, the contact etching stop layer and the interlayer dielectric layer 95 are formed, without forming a silicide layer. Then, a contact hole is formed in the interlayer dielectric layer 95 to expose the upper surface of the epitaxial source/drain structure 60, and then a silicide layer is formed on the upper surface of the epitaxial source/drain structure 60. After forming the silicide layer, the conductive material is formed in the contact hole, thereby forming a contact plug.

Figure 18:
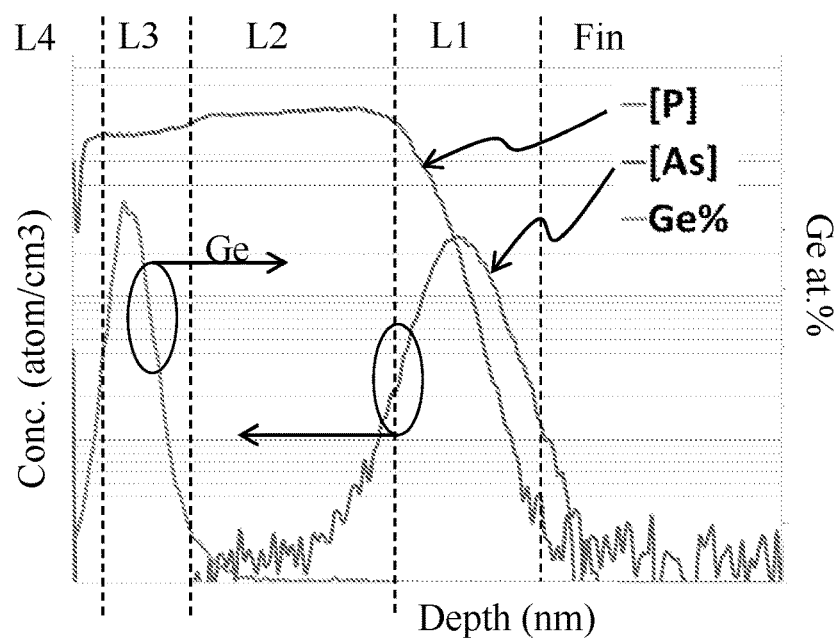
FIG. 18 shows an elemental analysis result of a source/drain structure according to an embodiment of the present disclosure.

FIG. 18 shows an elemental analysis in a depth direction Z18 as shown in FIG. 13B after the source/drain epitaxial layer 60 is formed. As shown in FIG. 18, arsenic in the first epitaxial layer 62 (L1) can effectively suppress diffusion of P from the second epitaxial layer 64 (L2) into the fin structure.

Although foregoing embodiments describe a FinFET, the technologies disclosed in the present disclosure are also applicable to other types of FETs, such as a planar FET and a gate-all-around (GAA) FET using a nanowire or a nanosheet semiconductor.

In the embodiments of the present disclosure, by forming a SiAs layer as the first epitaxial layer, it is possible to suppress diffusion of P from the second epitaxial layer into the channel region. Further, by setting a merger point of the merged epitaxial layer to the relatively high location, it is possible to improve short channel effects.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first fin structure and a second fin structure are formed over a substrate, an isolation insulating layer is formed over the substrate so that lower portions of the first and second fin structure are embedded in the isolation insulating layer and upper portions of the first and second fin structures are exposed from the isolation insulating layer, a gate structure is formed over channel regions of the first and second fin structures, source/drain regions of the first and second fin structure are recessed, and an epitaxial source/drain structure is formed over the recessed first and second fin structures. The epitaxial source/drain structure is a merged structure having a merger point, and a height of a bottom of the merger point from an upper surface of the isolation insulating layer is 50% or more of a height of the channel regions of the first and second fin structures from the upper surface of the isolation insulating layer. In one or more of the foregoing and following embodiments, the height of the bottom of the merger point from an upper surface of the isolation insulating layer is 75% or more of the height of the channel regions of the first and second fin structures from the upper surface of the isolation insulating layer. In one or more of the foregoing and following embodiments, the epitaxial source/drain structure includes first, second, third and fourth epitaxial layers formed in this order over the recessed first and second fin structures. In one or more of the foregoing and following embodiments, the first epitaxial layer over the recessed first fin structure and the first epitaxial layer over the recessed second fin structure are not merged, and the second epitaxial layer creates the merger point. In one or more of the foregoing and following embodiments, the first epitaxial layer includes SiAs and the second epitaxial layer includes SiP. In one or more of the foregoing and following embodiments, the third epitaxial layer includes SiP doped with Ge, and the fourth epitaxial layer includes SiP. In one or more of the foregoing and following embodiments, a P concentration of the second epitaxial layer is highest in the first to fourth epitaxial layers. In one or more of the foregoing and following embodiments, the third epitaxial layer is in contact with the first epitaxial layer.

In accordance with another aspect of the present disclosure, in a method of manufacturing a semiconductor device, a first fin structure and a second fin structure are formed over a substrate, an isolation insulating layer is formed over the substrate so that lower portions of the first and second fin structure are embedded in the isolation insulating layer and upper portions of the first and second fin structures are exposed from the isolation insulating layer, fin sidewalls are formed on opposing side faces of source/drain regions of the first and second fin structures, source/drain regions of the first and second fin structure are recessed, a first epitaxial layer is formed over the recessed first and second fin structures, respectively, a second epitaxial layer having a different composition than the first epitaxial layer is formed over the first epitaxial layer, respectively to form a merged second epitaxial layer having a merger point. A height of a bottom of the merger point from an upper surface of the isolation insulating layer is 50% or more of a height of the channel regions of the first and second fin structures from the upper surface of the isolation insulating layer. In one or more of the foregoing and following embodiments, the forming the second epitaxial layer comprises one or more deposition phases and one or more etching phases, alternately performed. In one or more of the foregoing and following embodiments, the forming the second epitaxial layer comprises forming a lower layer over the first epitaxial layer not forming the merged second epitaxial layer, and forming an upper layer over the lower layer forming the second epitaxial layer, and the forming the upper layer includes no etching phase. In one or more of the foregoing and following embodiments, the upper layer is formed after the etching phase of the lower layer. In one or more of the foregoing and following embodiments, the first epitaxial layer includes SiAs with an As concentration in a range from $1\times10^{20}$ atoms/cm$^3$ to $2\times10^{21}$ atoms/cm$^3$. In one or more of the foregoing and following embodiments, the second epitaxial layer includes SiP with a P concentration in a range from $5\times10^{20}$ atoms/cm$^3$ to $5\times10^{21}$ atoms/cm$^3$. In one or more of the foregoing and following embodiments, the first epitaxial layer is formed not to exceed a top of the fin sidewalls. In one or more of the foregoing and following embodiments, the fin sidewalls incudes multiple layers.

In accordance with another aspect of the present disclosure, in a method of manufacturing a semiconductor device, a first fin structure and a second fin structure are formed over a substrate, an isolation insulating layer is formed over the substrate so that lower portions of the first and second fin structure are embedded in the isolation insulating layer and upper portions of the first and second fin structures are exposed from the isolation insulating layer, fin sidewalls are formed on opposing side faces of source/drain regions of the first and second fin structures, source/drain regions of the first and second fin structure are recessed, a first epitaxial layer is formed over the recessed first and second fin structures, respectively, at a first temperature, an etching operation is performed on the first epitaxial layer at a second temperature, a second epitaxial layer having a different composition than the first epitaxial layer is formed over the first epitaxial layer, respectively, at a third temperature, a third epitaxial layer having a different composition than the second epitaxial layer is formed over the second epitaxial layer, at a fourth temperature, an etching operation is performed on the third epitaxial layer at a fifth temperature, and a fourth epitaxial layer having a different composition than the third epitaxial layer is formed over the third epitaxial layer, at a sixth temperature. In one or more of the foregoing and following embodiments, the second epitaxial layer forms a merged second epitaxial layer having a merger point, and a height of a bottom of the merger point from an upper surface of the isolation insulating layer is 50% or more of a height of the channel regions of the first and second fin structures from the upper surface of the isolation insulating layer. In one or more of the foregoing and following embodiments, the forming the second epitaxial layer comprises one or more deposition phases and one or more etching phases, alternately performed. In one or more of the foregoing and following embodiments, the forming the second epitaxial layer comprises forming a lower layer over the first epitaxial layer not forming the merged second epitaxial layer, and forming an upper layer over the lower layer forming the second epitaxial layer, and the forming the upper layer includes no etching phase. In one or more of the foregoing and following embodiments, wherein the second temperature is higher than the first temperature. In one or more of the foregoing and following embodiments, the third temperature is lower than the second temperature. In one or more of the foregoing and following embodiments, the fourth temperature is higher than the third temperature. In one or more of the foregoing and following embodiments, the fifth temperature is higher than the fourth temperature.

In accordance with another aspect of the present disclosure, a semiconductor device includes an isolation insulating layer disposed over a substrate, a first fin structure and a second fin structure disposed over the substrate, a gate structure disposed over channel regions of the first and second fin structures, and a source/drain epitaxial layer over source/drain regions of the first and second fin structures. The source/drain epitaxial layer has a merged structure having a merger point, and a height of a bottom of the merger point from an upper surface of the isolation insulating layer is 65% or more of a height of the channel regions of the first and second fin structures from the upper surface of the isolation insulating layer. In one or more of the foregoing and following embodiments, a vertical thickness of the merger point is in a range from 10% to 30% of a height of the source/drain epitaxial layer from an upper surface of the isolation insulating layer. In one or more of the foregoing and following embodiments, the source/drain epitaxial layer includes first, second, third and fourth epitaxial layers formed in this order over the recessed first and second fin structures. In one or more of the foregoing and following embodiments, the first epitaxial layer includes SiAs, and the second epitaxial layer includes SiP.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
an isolation insulating layer disposed over a substrate;
a first fin structure disposed over the substrate;
a gate structure disposed over a channel region of the first fin structure;
a first source/drain epitaxial layer disposed over the first fin structure; and
a first fin liner layer disposed on side faces of a part of the first in structure and a part of the first epitaxial layer, wherein:
the first fin liner layer includes a lower portion disposed on one of the side faces and a higher portion disposed on another of the side faces,
a height of the lower portion is smaller than a height of the higher portion, and
the first fin liner layer includes a vertical portion having a first dielectric layer and a second dielectric layer and a horizontal portion having the second dielectric layer and not having the first dielectric layer.

2. The semiconductor device of claim 1, wherein the height of the lower portion is located above an interface between the first fin structure and the first source/drain epitaxial layer.

3. The semiconductor device of claim 1, wherein:
the first source/drain epitaxial layer includes a first layer on the first fin structure and a second layer on the first layer, and
the height of the higher portion is higher than an interface between the first layer and the second layer.

4. The semiconductor device of claim 3, wherein a thickness of the first layer is in a range from 3 nm to 20 nm.

5. The semiconductor device of claim 1, wherein the first and second dielectric layers of the higher portion are in contact with the first layer and the second layer of the first source/drain epitaxial layer.

6. The semiconductor device of claim 5, wherein the second dielectric layer of the lower portion is not in contact with the second layer of the first source/drain epitaxial layer.

7. The semiconductor device of claim 1, wherein the first dielectric layer is made of silicon oxide, and the second dielectric layer is made of silicon nitride.

8. A semiconductor device comprising:
an isolation insulating layer disposed over a substrate;
a first fin structure and a second fin structure disposed over the substrate;
a first source/drain epitaxial layer disposed over the first fin structure;
a second source/drain epitaxial layer disposed over the second fin structure;
a first fin liner layer disposed on side faces of a part of the first in structure and a part of the first epitaxial layer; and
a second fin liner layer disposed on side faces of a part of the second in structure and a part of the second epitaxial layer, wherein:
the first fin liner layer includes an inside portion disposed on a side of the second fin structure and an outside portion,
a height of the inside portion is different from a height of the outside portion, and
the first fin liner layer includes a vertical portion having a first dielectric layer and a second dielectric layer and a horizontal portion having the second dielectric layer and not having the first dielectric layer.

9. The semiconductor device of claim 8, wherein:
the second fin liner layer includes an inside portion disposed on a side of the first fin structure and an outside portion, and
a height of the inside portion of the second fin liner layer is different from a height of the outside portion of the second fin liner layer.

10. The semiconductor device of claim 9, wherein the height of the inside portion of the first fin liner layer and the height of the inside portion of the second fin liner layer are smaller than the height of the outside portion of the first fin liner layer and the height of the outside portion of the second fin liner layer.

11. The semiconductor device of claim 8, wherein:
the first source/drain epitaxial layer includes a first layer on the first fin structure and a second layer on the first layer, and
the height of the higher portion is higher than an interface between the first layer and the second layer.

12. The semiconductor device of claim 11, wherein the second fin liner layer includes a vertical portion having a third dielectric layer and a fourth dielectric layer and a horizontal portion having the fourth dielectric layer and not having the third dielectric layer.

13. The semiconductor device of claim 8, wherein the first and second dielectric layers of the higher portion are in contact with the first layer and the second layer of the first source/drain epitaxial layer.

14. The semiconductor device of claim 13, wherein the second dielectric layer of the lower portion is not in contact with the second layer of the first source/drain epitaxial layer.

15. The semiconductor device of claim 8, wherein:
the first source/drain epitaxial layer and the second source/drain epitaxial layer is merged at a merger point, and
a height of a bottom of the merger point from an upper surface of the isolation insulating layer is 65% or more of a height of the channel regions of the first and second fin structures from the upper surface of the isolation insulating layer.

16. The semiconductor device of claim 15, wherein a vertical thickness of the merger point is in a range from 10% to 30% of a height of the first and second source/drain epitaxial layers from an upper surface of the isolation insulating layer.

17. The semiconductor device of claim 16, wherein each of the first and second source/drain epitaxial layers includes first, second, third and fourth epitaxial layers over the recessed first and second fin structures.

18. The semiconductor device of claim 17, wherein the first epitaxial layer includes SiAs, and the second epitaxial layer includes SiP.

19. A method of manufacturing a semiconductor device, the method comprising:
forming a first fin structure and a second fin structure over a substrate;
forming an isolation insulating layer over the substrate so that lower portions of the first and second fin structure are embedded in the isolation insulating layer and upper portions of the first and second fin structures are exposed from the isolation insulating layer;
forming fin sidewalls on opposing side faces of source/drain regions of the first and second fin structures;
recessing source/drain regions of the first and second fin structure;

forming a first epitaxial layer over the recessed first and second fin structures, respectively, at a first temperature;

forming a second epitaxial layer having a different composition than the first epitaxial layer over the first epitaxial layer, wherein:

after the source/drain regions are recessed, a height of the fin sidewalls located at a second fin structure side is different from a height of the fin sidewalls located at an opposing side, and the first epitaxial layer is formed from a level equal to a top of the fin sidewall located at the second fin structure side to a level of 2 nm below the top of the fin sidewall located at the second fin structure side.

20. The method of claim 19, wherein the first epitaxial layer includes SiAs, and the second epitaxial layer includes SiP.

* * * * *